(12) United States Patent
Lee et al.

(10) Patent No.: US 11,963,375 B2
(45) Date of Patent: Apr. 16, 2024

(54) LIGHT-EMITTING DEVICE AND ELECTRONIC APPARATUS INCLUDING SAME

(71) Applicant: Samsung Display Co., Ltd., Yongin-si (KR)

(72) Inventors: Jiyoung Lee, Yongin-si (KR); Makoto Yamamoto, Yongin-si (KR); Toshiyuki Matsuura, Yongin-si (KR); Hyunyoung Kim, Yongin-si (KR); Hyosup Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 560 days.

(21) Appl. No.: 17/227,886

(22) Filed: Apr. 12, 2021

(65) Prior Publication Data
US 2022/0085313 A1    Mar. 17, 2022

(30) Foreign Application Priority Data
Sep. 11, 2020    (KR) .................... 10-2020-0117040

(51) Int. Cl.
*H10K 50/11*     (2023.01)
*G02B 1/08*      (2006.01)
(Continued)

(52) U.S. Cl.
CPC ............... *H10K 50/11* (2023.02); *G02B 1/08* (2013.01); *G02B 5/20* (2013.01); *H01L 33/50* (2013.01);
(Continued)

(58) Field of Classification Search
CPC ...... H10K 50/11; H10K 85/346; H10K 85/40; H10K 85/623; H10K 85/624;
(Continued)

(56) References Cited

U.S. PATENT DOCUMENTS 8,994,013 B2    3/2015  Seo
9,299,944 B2    3/2016  Seo et al.
(Continued)

FOREIGN PATENT DOCUMENTS

KR      10-1419810       7/2014
KR    10-2015-0059324    6/2015
(Continued)

OTHER PUBLICATIONS

M. Segal et al., "Extrafluorescent Electroluminescence in Organic Light-Emitting Devices", Nature Materials, May 2007, pp. 374-378, vol. 6.
(Continued)

*Primary Examiner* — Caleb E Henry
(74) *Attorney, Agent, or Firm* — KILE PARK REED & HOUTTEMAN PLLC

(57) ABSTRACT

A light-emitting device includes a first electrode. a second electrode facing the first electrode, and an interlayer between the first electrode and the second electrode and including an emission layer. The emission layer may include a hole transporting host, an electron transporting host, a sensitizer, and a delayed fluorescence dopant. The hole transporting host and the electron transporting host may form an exciplex. The sensitizer may include an organometallic compound. The delayed fluorescence dopant may not include a metal atom, and the exciplex may satisfy specific Equations.

20 Claims, 5 Drawing Sheets

(51) Int. Cl.
    *G02B 5/20* (2006.01)
    *H01L 33/50* (2010.01)
    *H10K 50/15* (2023.01)
    *H10K 50/16* (2023.01)
    *H10K 85/30* (2023.01)
    *H10K 85/40* (2023.01)
    *H10K 85/60* (2023.01)
    *H10K 101/10* (2023.01)
    *H10K 101/40* (2023.01)

(52) U.S. Cl.
    CPC ........... *H10K 85/346* (2023.02); *H10K 85/40* (2023.02); *H10K 85/623* (2023.02); *H10K 85/624* (2023.02); *H10K 85/636* (2023.02); *H10K 85/654* (2023.02); *H10K 85/6572* (2023.02); *H10K 85/6574* (2023.02); *H10K 50/15* (2023.02); *H10K 50/16* (2023.02); *H10K 2101/10* (2023.02); *H10K 2101/40* (2023.02)

(58) Field of Classification Search
    CPC ............... H10K 85/636; H10K 85/654; H10K 85/6572; H10K 85/6574; H10K 50/15; H10K 50/16; H10K 2101/10; H10K 2101/40; H10K 2101/20; H10K 2101/90; H10K 50/12; H10K 59/00; H10K 85/00; H10K 85/322; H10K 2101/00; G02B 1/08; G02B 5/20; H01L 33/50
    See application file for complete search history.

(56) References Cited

U.S. PATENT DOCUMENTS

| | | | | |
|---|---|---|---|---|
| 10,388,897 | B2* | 8/2019 | Snaith | H10K 85/00 |
| 10,418,573 | B2 | 9/2019 | Kim et al. | |
| 2013/0306945 | A1* | 11/2013 | Seo | H10K 50/16 |
| | | | | 257/40 |
| 2013/0330632 | A1* | 12/2013 | Burschka | H01M 4/624 |
| | | | | 429/246 |
| 2014/0034930 | A1* | 2/2014 | Seo | H10K 50/16 |
| | | | | 257/40 |
| 2014/0239288 | A1* | 8/2014 | Delcamp | H10K 85/654 |
| | | | | 257/40 |
| 2015/0340623 | A1* | 11/2015 | Kawamura | C09B 69/008 |
| | | | | 257/40 |
| 2016/0028022 | A1* | 1/2016 | Seo | C07D 403/14 |
| | | | | 257/40 |
| 2016/0093812 | A1* | 3/2016 | Stoessel | H10K 85/30 |
| | | | | 438/46 |
| 2016/0233439 | A1* | 8/2016 | Burschka | H10K 71/30 |
| 2017/0117488 | A1 | 4/2017 | Ahn et al. | |
| 2018/0066383 | A1* | 3/2018 | Bakr | C30B 31/12 |
| 2018/0277765 | A1* | 9/2018 | Yen | H10K 85/624 |
| 2019/0058124 | A1 | 2/2019 | Hatakeyama et al. | |
| 2019/0097155 | A1 | 3/2019 | Kim et al. | |
| 2019/0207112 | A1 | 7/2019 | Hatakeyama et al. | |
| 2019/0229270 | A1* | 7/2019 | Yen | C07D 413/14 |
| 2019/0296254 | A1 | 9/2019 | Ko et al. | |
| 2020/0006676 | A1 | 1/2020 | Kwak et al. | |
| 2020/0168818 | A1 | 5/2020 | Lin et al. | |
| 2020/0266374 | A1 | 8/2020 | Ko | |
| 2021/0167304 | A1* | 6/2021 | Scholz | H10K 85/611 |

FOREIGN PATENT DOCUMENTS

| | | |
|---|---|---|
| KR | 10-2016-0101519 | 8/2016 |
| KR | 10-2018-0027468 | 3/2018 |
| KR | 10-2018-0108604 | 10/2018 |
| KR | 10-2018-0134850 | 12/2018 |
| KR | 10-2019-0012117 | 2/2019 |
| KR | 10-2019-0112232 | 10/2019 |
| KR | 10-2019-0143282 | 12/2019 |
| KR | 10-2052475 | 12/2019 |
| KR | 10-2020-0100879 | 8/2020 |

OTHER PUBLICATIONS

Dan Li et al., "Highly Efficient Deep-Red Organic Light-Emitting Diodes Using Exciplex-Forming Co-Hosts and Thermally Activated Delayed Fluorescent Sensitizers with Extended Lifetime", Journal of Materials Chemistry C, Jul. 15, 2019, pp. 1-8.

Takuya Hosokai et al. "Solvent-Dependent Investigation of Carbazole Benzonitrile Derivatives: Does the $^3$LE-$^1$CT Energy Gap Facilitate Thermally Activated Delayed Fluorescence?", Journal of Photonics for Energy, Jul.- Sep. 2018, pp. 032102-1-032102-9, vol. 8(3).

\* cited by examiner

LIGHT-EMITTING DEVICE AND ELECTRONIC APPARATUS INCLUDING SAME

CROSS-REFERENCE TO RELATED APPLICATION(S)

This application claims priority to and benefits of Korean Patent Application No. 10-2020-0117040 under 35 U.S.C. § 119, filed on Sep. 11, 2020 in the Korean Intellectual Property Office, the entire contents of which are incorporated herein by reference.

BACKGROUND

1. Technical Field

Embodiments relate to a light-emitting device and an electronic apparatus including the light-emitting device.

2. Description of the Related Art

Light-emitting devices are self-emission devices that have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Embodiments relate to a light-emitting device that may satisfy specific conditions and an electronic apparatus including the light-emitting device.

Additional aspects will be set forth in part in the description which follows and, in part, will be apparent from the description, or may be learned by practice of the embodiments of the disclosure.

According to embodiments, a light-emitting device may include:
 a first electrode;
 a second electrode facing the first electrode; and
 an interlayer between the first electrode and the second electrode and including an emission layer,
  wherein the emission layer may include a hole transporting host, an electron transporting host, a sensitizer, and a delayed fluorescence dopant,
 the hole transporting host and the electron transporting host may form an exciplex,
 the sensitizer may include an organometallic compound,
 the delayed fluorescence dopant may not include a metal atom, and
 the exciplex may satisfy Equations 1 and 2:

$$\Delta E_{1CT-3LE} = |E(^1CT) - E(^3LE)| \le 0.06\,eV \quad \text{[Equation 1]}$$

$$E(^3LE) \ge E(^3CT) \quad \text{[Equation 2]}$$

wherein in Equations 1 and 2,
 $E(^1CT)$ represents an energy level (eV) of a singlet charge-transfer state ($^1CT$) of the exciplex,
 $E(^3CT)$ represents an energy level (eV) of a triplet charge-transfer state ($^3CT$) of the exciplex, and
 $E(^3LE)$ represents an energy level (eV) of a triplet localized excited state ($^3LE$) of the exciplex.

In an embodiment, $\Delta E_{CT}$, which is an energy gap between $E(^1CT)$ and $E(^3CT)$ of the exciplex, may be in a range of about 0.1 electron volts (eV) to about 0.2 eV.

In an embodiment, $\phi_{DF}/\phi_{PF}$, which is a ratio of a delayed fluorescence photoluminescence quantum yield (PLQY) ($\phi_{DF}$) to a prompt fluorescence PLQY ($\phi_{PF}$) of the exciplex, may be equal to or less than about 0.3.

In an embodiment, the energy level of the triplet localized excited state of the exciplex may include $E1(^3LE)$ and $E2(^3LE)$, $E1(^3LE) \ne E2(^3LE)$, $E1(^3LE)$ may be equal to a triplet energy level (eV) of the hole transporting host, and $E2(^3LE)$ may be equal to a triplet energy level (eV) of the electron transporting host.

In an embodiment, $E1(^3LE) > E2(^3LE)$, and the exciplex may satisfy $E(^1CT) - E1(^3LE) \ge 0.06$ eV.

In an embodiment, the exciplex may satisfy $E(^1CT) > E(^3LE)$.

In an embodiment, a difference between an energy level of a highest occupied molecular orbital (HOMO) of the hole transporting host and an energy level of a HOMO of the electron transporting host may be equal to or greater than about 0.2 eV, and a difference between an energy level of a lowest unoccupied molecular orbital (LUMO) of the hole transporting host and an energy level of a LUMO of the electron transporting host may be equal to or greater than about 0.2 eV.

In an embodiment, the sensitizer may not emit light, and the delayed fluorescence dopant may emit fluorescence.

In an embodiment, the light-emitting device may emit blue light having a maximum emission wavelength in a range of about 450 nanometers (nm) to about 470 nm.

In an embodiment, the hole transporting host may include a compound including at least one carbazole group.

According to embodiments, an electronic apparatus may include the light-emitting device.

In an embodiment, the electronic apparatus may further include a thin-film transistor. The thin-film transistor may include a source electrode and a drain electrode, and the first electrode of the light-emitting device may be electrically connected to the source electrode or the drain electrode of the thin-film transistor.

In an embodiment, the electronic apparatus may further include a functional layer comprising a touchscreen layer, a polarization layer, a color filter, a color-conversion layer, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
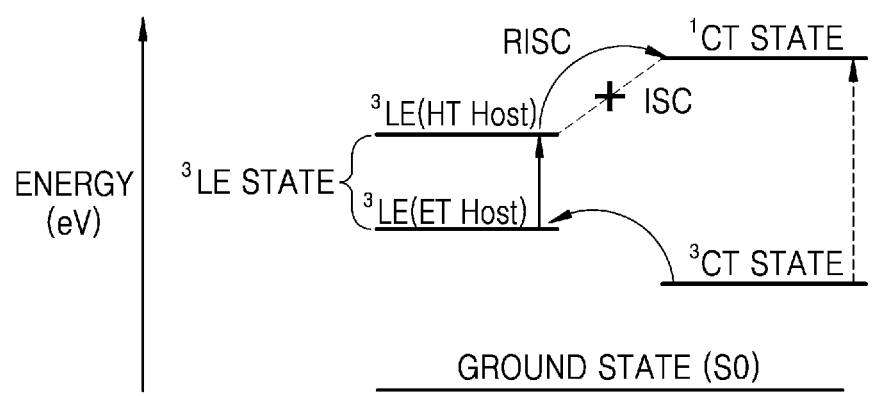
FIG. 1 is a schematic view of an energy transfer mechanism of an exciplex in a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As the inventive concept allows for various changes and numerous embodiments, embodiments will be illustrated in the drawings and described in detail in the written description. Effects, features, and a method of achieving the inventive concept will be apparent by referring to embodiments of the inventive concept with reference to the attached drawings. The inventive concept may, however, be embodied in many different forms and should not be construed as being limited to the embodiments set forth herein.

Hereinafter, the inventive concept will be described in detail by explaining example embodiments of the inventive concept with reference to the attached drawings.

In the embodiments described in the specification, an expression used in the singular such as "a," "an," and "the" are intended to include the plural forms as well, unless the context clearly indicates otherwise.

In the specification, it is to be understood that the terms such as "comprises," "comprising," "includes," "including," "have," "having," "contains," "containing," and the like are intended to specify the existence of stated features, integers, steps, operations, elements, components, or combinations thereof in the specification, but do not preclude the presence or addition of one or more other features, integers, steps, operations, elements, components, or combinations thereof.

In the description, it will be understood that when an element (a region, a layer, a section, or the like) is referred to as being "on", "connected to" or "coupled to" another element, it can be directly on, connected or coupled to the other element, or one or more intervening elements may be disposed therebetween.

Sizes of components in the drawings may be exaggerated for convenience of explanation. Therefore, as the sizes and thicknesses of components in the drawings are arbitrarily illustrated for convenience of explanation, the following embodiments are not limited thereto.

The term "interlayer" as used herein refers to a single layer and/or all layers located between a first electrode and a second electrode in a light-emitting device.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Description of FIG. 1

FIG. 1 is a schematic view for illustrating an energy transfer mechanism of an exciplex in a light-emitting device according to an embodiment.

The hole transporting host and the electron transporting host included in an emission layer of a light-emitting device may form an exciplex.

A charge-transfer excited state of the exciplex may include a singlet state and a triplet state. For example, the exciplex may have a singlet charge-transfer state ($^1$CT) and a triplet charge-transfer state ($^3$CT). A triplet localized excited state ($^3$LE) that is a triplet state different from the $^3$CT state may be present in the exciplex. As the triplet localized excited state may have properties of a triplet state of each of the hole transporting host and the electron transporting host, the exciplex may have a triplet localized excited state $^3$LE(HT host) having properties of a triplet state of the hole transporting host and $^3$LE(ET host) having properties of a triplet state of the electron transporting host.

In "$^1$CT", "1" represents a singlet state, and in "$^3$CT" and "$^3$LE", "3" represents a triplet state.

In embodiments, the exciplex may satisfy Equation 1:

$$\Delta E_{1CT\text{-}3LE} = |E(^1CT) - E(^3LE)| \geq 0.06 eV \qquad [\text{Equation 1}]$$

wherein, in Equation 1,

E($^1$CT) represents an energy level (eV) of a singlet charge-transfer state ($^1$CT) of the exciplex, and E($^3$LE) represents an energy level (eV) of a triplet localized excited state ($^3$LE) of the exciplex.

When the exciplex satisfies Equation 1, a probability of transfer from the $^1$CT state to $^3$LE state through the intersystem crossing of the singlet exciton may be lowered. Accordingly, a ratio of energy transfer from the exciplex to the sensitizer and/or the delayed fluorescence dopant according to Förster energy transfer mechanism may increase. Accordingly, a ratio of energy transfer according to Dexter energy transfer mechanism from the exciplex may decrease.

For example, when the energy level of the $^1$CT state of the exciplex is red-shifted to thereby decrease $\Delta E_{1CT-3LE}$, transfer from the $^1$CT state to $^3$LE state through the intersystem crossing of the singlet exciton may occur, thus increasing the triplet exciton density. The increase in the triplet exciton density may induce deterioration of the light-emitting device, e.g., induce a shorter lifespan of the light-emitting device. In embodiments, as the exciplex satisfies the condition $\Delta E_{1CT-3LE} \geq 0.06$ eV, the intersystem crossing rate may be relatively slow to thereby increase the Förster transfer probability, and the exciplex may have a low triplet exciton density. Accordingly, the light-emitting device according to embodiments may suppress deterioration of device characteristics and have a longer lifespan.

In embodiments, the exciplex may satisfy Equation 2:

$$E(^3LE) E(^3CT) \quad \text{[Equation 2]}$$

wherein, in Equation 2, $E(^3CT)$ represents an energy level (eV) of a triplet charge-transfer state ($^3$CT) of the exciplex.

When an electron transporting host has a low triplet energy level, the $^3$LE state energy level of the electron transporting host may be low, and the $^3$CT state energy level of the exciplex may also be low, accordingly. Thus, $E(^3CT)$ may be greater than $E(^3LE)$. When $E(^3CT)$ is greater than $E(^3LE)$, the probability of the triplet excitons in the $^3$CT state to transfer to the $^3$LE state by the internal conversion may be greater, and thus, triplet annihilation may readily occur. In an embodiment, the energy gap ($\Delta E_{CT}$) between the $^1$CT state and the $^3$CT state may increase, and thus, the up-conversion rate from the $^3$CT state to $^1$CT state may be low. Thus, reverse intersystem crossing (RISC) may not occur smoothly. Accordingly, as the triplet exciton lifetime increases, the lifespan of the light-emitting device may decrease.

As the exciplex satisfies Equation 2, the triplet annihilation may be suppressed, and the energy gap ($\Delta E_{CT}$) between the $^1$CT state and the $^3$CT state may be sufficiently small. Thus, RISC may effectively occur, and thus the light-emitting device may emit fluorescence of high luminescence efficiency.

In embodiments, the energy level of the triplet localized excited state of the exciplex may have different values of 2 or more.

For example, the energy level of the exciplex in the triplet localized excited state may include $E1(^3LE)$ and $E2(^3LE)$, $E1(^3LE) \neq E2(^3LE)$, $E1(^3LE)$ may be equal to the triplet energy level (eV) of the hole transporting host, and $E2(^3LE)$ may be equal to the triplet energy level (eV) of the electron transporting host.

As the exciplex is an excited complex, which may be formed by physical contact of the hole transporting host and the electron transporting host, the exciplex may have the triplet states, which may each have characteristics of the hole transporting host and characteristics of the electron transporting host, respectively. Accordingly, the energy level of each of the $^3$LE states may vary depending on the triplet energy level of each of the hole transporting host and the electron transporting host, E1 ($^3$LE) may be substantially the same as the triplet energy level of the hole transporting host, and $E2(^3LE)$ may be substantially the same as the triplet energy level of the electron transporting host.

In embodiments, E1 ($^3$LE) may be greater than $E2(^3LE)$, and the exciplex may satisfy $E(^1CT)-E1(^3LE) \geq 0.06$ eV.

In embodiments, the exciplex may satisfy that $E(^1CT) > E(^3LE)$. When the condition $E(^1CT) > E(^3LE)$ is satisfied, Förster energy transfer rate may be increased, thus improving lifespan of the light-emitting device.

In embodiments, $\Delta E_{CT}$, which is an energy gap between $E(^1CT)$ and $E(^3CT)$ of the exciplex, may be in a range of about 0.1 eV to about 0.2 eV. When $\Delta E_{CT}$ is within this range, intersystem crossing in the exciplex may effectively occur.

In embodiments, $\phi_{DF}/\phi_{PF}$, which is a ratio of a delayed fluorescence photoluminescence quantum yield (PLQY) ($\phi_{DF}$) to a prompt fluorescence PLQY ($\phi_{PF}$) of the exciplex, may be equal to or less than about 0.3. In embodiments, each of the delayed fluorescence PLQY and the prompt fluorescence PLQY of the exciplex may be obtained from the photoluminance (PL) spectrum and the TrPL spectrum measured at room temperature from a thin film formed by co-deposition of the hole transporting host and the electron transporting host on a substrate. The measurement may be understood by referring to the descriptions in the Examples and Evaluation Examples.

In embodiments, a difference between an energy level of a highest occupied molecular orbital (HOMO) of the hole transporting host included in the emission layer and an energy level of a HOMO of the electron transporting host included in the emission layer may be equal to or greater than about 0.2 eV, and a difference between an energy level of a lowest unoccupied molecular orbital (LUMO) of the hole transporting host and an energy level of a LUMO of the electron transporting host may be equal to or greater than about 0.2 eV. When a difference between the HOMO energy levels of the hole transporting host and the electron transporting host and a difference between the LUMO energy levels of the hole transporting host and the electron transporting host are each within this range, the exciplex may be formed effectively.

In embodiments, a delayed fluorescence dopant in the emission layer may be a compound that satisfies Equation 3:

$$\Delta E_{ST} = E_D(S1) - E_D(T1) \leq 0.2 eV \quad \text{[Equation 3]}$$

wherein, in Equation 3, $E_D(S1)$ represents a lowest singlet energy level (eV) of the delayed fluorescence dopant, and $E_D(T1)$ represents a lowest triplet energy level (eV) of the delayed fluorescence dopant.

When the difference between a triplet energy level of the delayed fluorescence dopant and a singlet energy level of the delayed fluorescence dopant is within this range, up-conversion from a triplet state to a singlet state in the delayed fluorescence dopant may effectively occur, thus improving luminescence efficiency and the like of the light-emitting device.

In embodiments, the light-emitting device may satisfy Equation 4:

$$E_{EX}(T1) > E_S(T1) > E_D(T1) \quad \text{[Equation 4]}$$

wherein, in Equation 4, $E_{EX}(T1)$ represents a lowest triplet energy level (eV) of the exciplex, $E_S(T1)$ represents a lowest triplet energy level (eV) of the sensitizer, and $E_D(T1)$ represents a lowest triplet energy level (eV) of the delayed fluorescence dopant.

When the light-emitting device satisfies Equation 4, back energy transfer may be effectively prevented to thereby transfer energy effectively from the exciplex to the delayed fluorescence dopant.

The hole transporting host, the electron transporting host, the sensitizer, and the delayed fluorescence dopant included in the emission layer are not particularly limited as long as the hole transporting host, the electron transporting host, the sensitizer, and the delayed fluorescence dopant each satisfy the conditions described above. Hereinafter, the hole transporting host, the electron transporting host, the sensitizer, and the delayed fluorescence dopant included in the emission layer will be described in detail.

[Hole Transporting Host]

In embodiments, the hole transporting host may include at least one π electron-rich $C_3$-$C_{60}$ cyclic group. The π electron-rich $C_3$-$C_{60}$ cyclic group may be understood by referring to the description thereof provided herein.

In embodiments, the hole transporting host may include a compound including at least one carbazole group.

In embodiments, the hole transporting host may include a compound represented by Formula 1-1 or Formula 1-2:

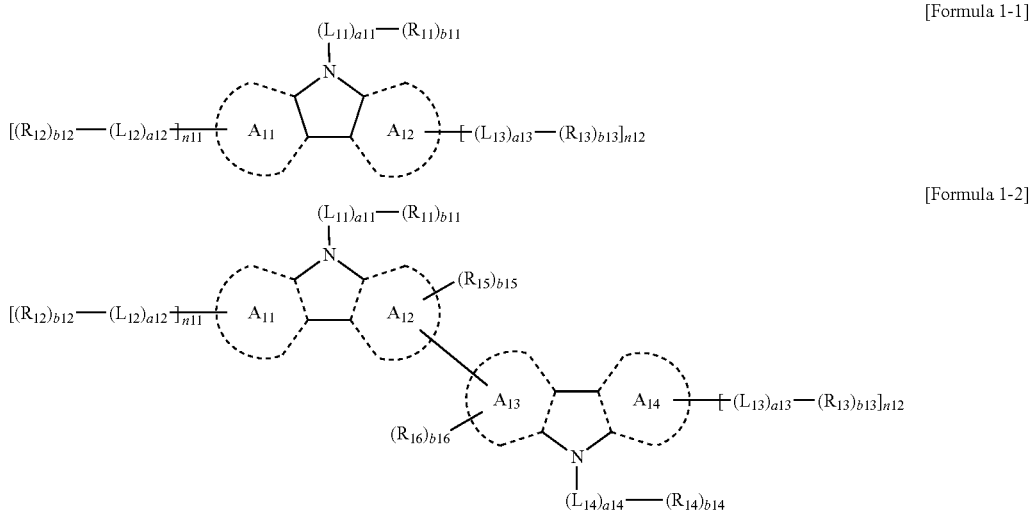

[Formula 1-1]

[Formula 1-2]

wherein, in Formulae 1-1 and 1-2, $A_{11}$ to $A_{14}$ may each independently be a $C_3$-$C_{60}$ carbocyclic group or a $C_1$-$C_{60}$ heterocyclic group, $L_{11}$ to $L_{14}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $a_{11}$ to $a_{14}$ may each independently be an integer from 0 to 5, $R_{11}$ to $R_{16}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and b11 to b16, n11, and n12 may each independently be an integer from 1 to 5.

$R_{10a}$ and $Q_1$ to $Q_3$ may respectively be understood by referring to the descriptions thereof provided herein.

In Formulae 1-1 and 1-2, a11 to a14 may respectively indicate the number of $L_{11}$(s) to $L_{14}$(s). When a11 is 0, $(L_{11})_{a11}$ may be a single bond, when a12 is 0, $(L_{12})_{a12}$ may be a single bond, when a13 is 0, $(L_{13})_{a13}$ may be a single bond, and when a14 is 0, $(L_{14})_{a14}$ may be a single bond.

In embodiments, in Formulae 1-1 and 1-2, $A_{11}$ to $A_{14}$ may each be a benzene group.

In embodiments, the hole transporting host may include a compound represented by Formula 1-1A:

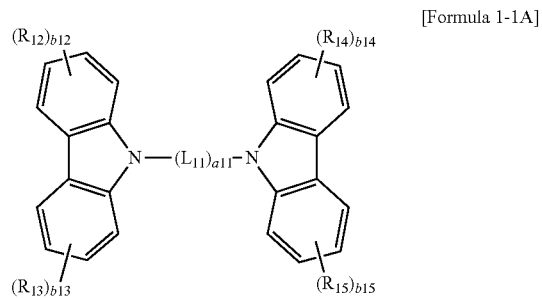

[Formula 1-1A]

wherein, in Formula 1-1A, $L_{11}$, a11, $R_{12}$ to $R_{15}$, and b12 to b15 may respectively be understood by referring to the descriptions of $L_{11}$, a11, $R_{12}$ to $R_{15}$, and b12 to b15 provided herein.

In embodiments, in Formula 1-1A, *-(L$_{11}$)$_{a11}$-*' represents a group represented by one of Formulae L-1 to L-9:

L-1
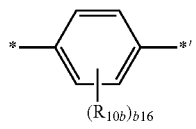

L-2
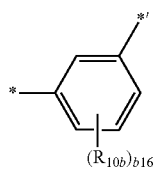

L-3
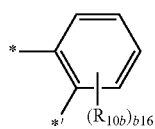

L-4
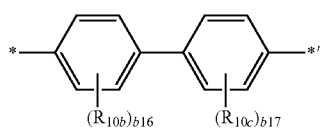

L-5
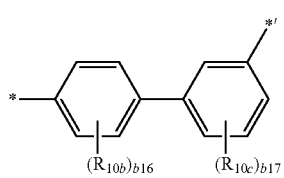

L-6
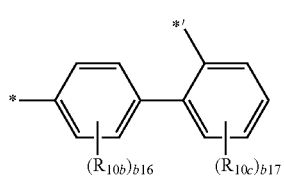

L-7
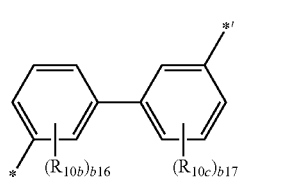

L-8
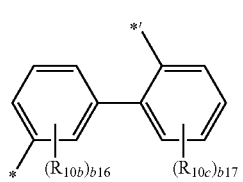

L-9
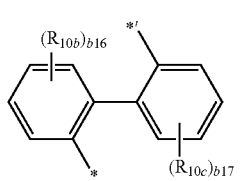

wherein, in Formulae L-1 to L-9,

R$_{10b}$ and R$_{10c}$ may each independently be understood by referring to the description of R$_{10a}$ provided herein, b16 and b17 may each independently be an integer from 0 to 4, and and *' each indicate a binding site to an adjacent atom.

In embodiments, the hole transporting host may include at least one of Compounds HTH1 to HTH9, but embodiments are not limited thereto:

HTH1
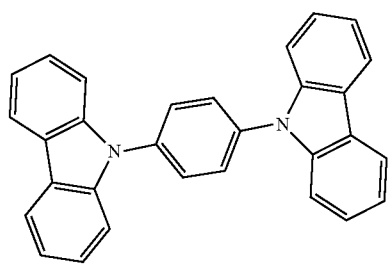

HTH2
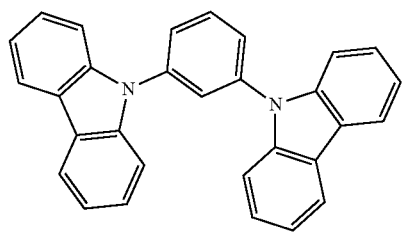

HTH3
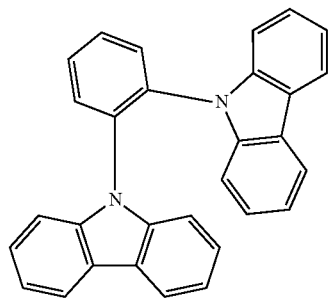

HTH4
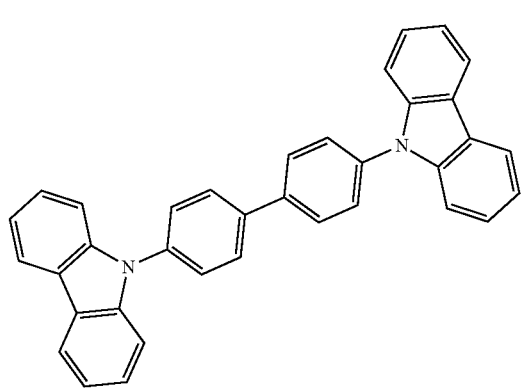

HTH5

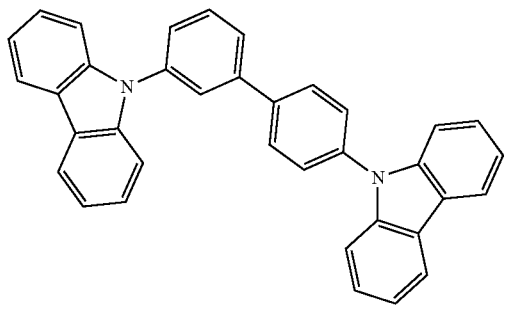

HTH9

HTH6

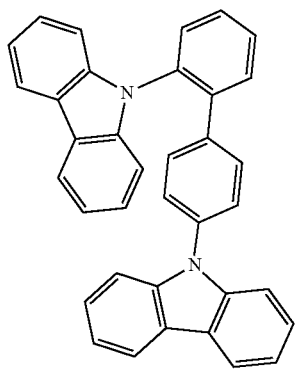

HTH7

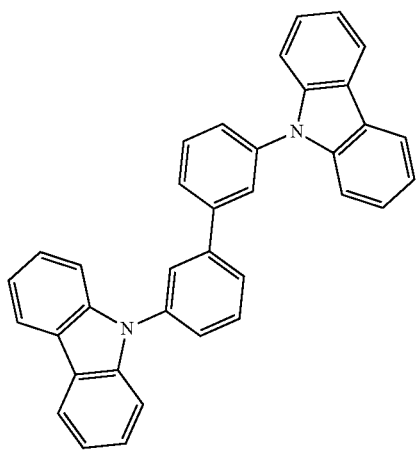

[Electron Transporting Host]

In embodiments, the electron transporting host may be a compound including at least one π electron-deficient nitrogen-containing $C_1$-$C_{60}$ cyclic group. The π electron-deficient nitrogen-containing $C_1$-$C_{60}$ cyclic group may be understood by referring to the description thereof provided herein.

In embodiments, the electron transporting host may be a compound including at least one π electron-deficient nitrogen-containing 6-membered ring.

In embodiments, the electron transporting host may include a compound represented by Formula 2:

[Formula 2]

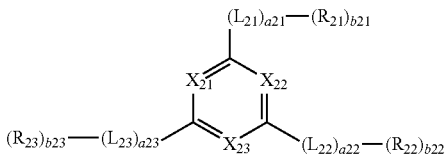

wherein, in Formula 2, $X_{21}$ may be N or C-$(L_{24})_{a24}$-$(R_{24})_{b24}$, $X_{22}$ may be N or C-$(L_{25})_{a25}$-$(R_{25})_{b25}$, and $X_{23}$ may be N or C-$(L_{26})_{a26}$-$(R_{26})_{b26}$, $L_{21}$ to $L_{26}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a26 may each independently be an integer from 0 to 5, $R_{21}$ to $R_{26}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and

HTH8

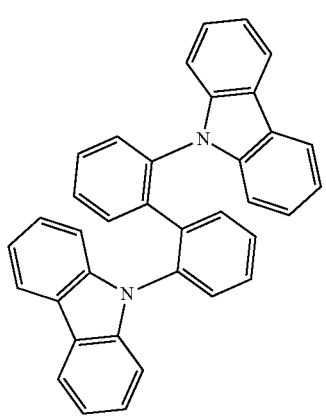

b21 to b26 may each independently be an integer from 1 to 5.

$R_{10a}$ and $Q_1$ to $Q_3$ may respectively be understood by referring to the descriptions thereof provided herein.

In Formula 2, a21 to a26 may respectively indicate the number of $L_{21}(s)$ to $L_{26}(s)$, and when a21 is 0, $(L_{21})_{a21}$ may be a single bond, when a22 is 0, $(L_{22})_{a22}$ may be a single bond, when a23 is 0, $(L_{23})_{a23}$ may be a single bond, when a24 is 0, $(L_{24})_{a24}$ may be a single bond, when a25 is 0, $(L_{25})_{a25}$ may be a single bond, and when a26 is 0, $(L_{26})_{a26}$ may be a single bond.

In embodiments, a21 to a26 may each independently be 0 or 1.

In embodiments, in Formula 2, $L_{21}$ to $L_{26}$ may each independently be a phenylene group unsubstituted or substituted with at least one $R_{10a}$, and a21 to a26 may each independently be 0 or 1.

In embodiments, in Formula 2, $R_{21}$ to $R_{26}$ may each independently be:
  a $C_1$-$C_{10}$ alkyl group unsubstituted or substituted with at least one phenyl group;
  a phenyl group or a carbazolyl group, each unsubstituted or substituted with a $C_1$-$C_{10}$ alkyl group, a phenyl group, a carbazolyl group, —Si$(Q_{31})(Q_{32})(Q_{33})$, or any combination thereof; or —Si$(Q_1)(Q_2)(Q_3)$, wherein $Q_1$ to $Q_3$ and $Q_{31}$ to $Q_{33}$ may respectively be understood by referring to the descriptions of $Q_1$ to $Q_3$ and $Q_{31}$ to $Q_{33}$ provided herein.

In embodiments, in Formula 2, at least one of $R_{21}(s)$ in the number of b21, $R_{22}(s)$ in the number of b22, and $R_{23}(s)$ in the number of b23 may be: a $C_1$-$C_{10}$ alkyl group substituted with at least one phenyl group; a phenyl group or a carbazolyl group unsubstituted or substituted with a phenyl group, a carbazolyl group, or any combination thereof; or Si$(Q_1)(Q_2)(Q_3)$. In embodiments, at least one of $R_{21}(s)$ in the number of b21, $R_{22}(s)$ in the number of b22, and $R_{23}(s)$ in the number of b23 may be: —C(Ph)$_3$; a phenyl group; a carbazolyl group; a carbazolyl group substituted with a phenyl group or a carbazolyl group; or —Si$(Q_1)(Q_2)(Q_3)$, wherein "Ph" represents a phenyl group.

In embodiments, the electron transporting host may include at least one of Compounds ETH1 to ETH13, but embodiments are not limited thereto:

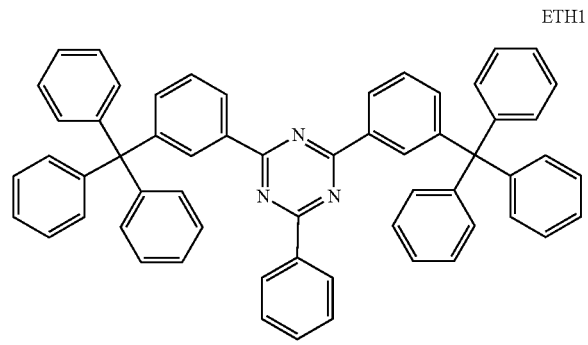

ETH1

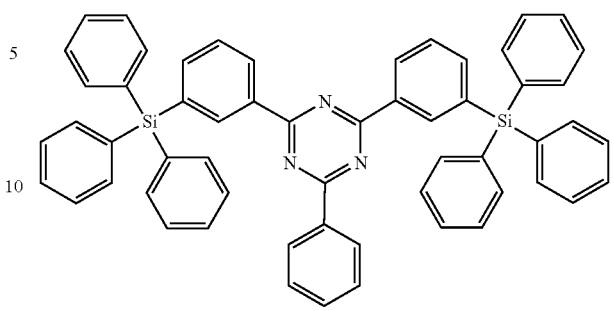

ETH2

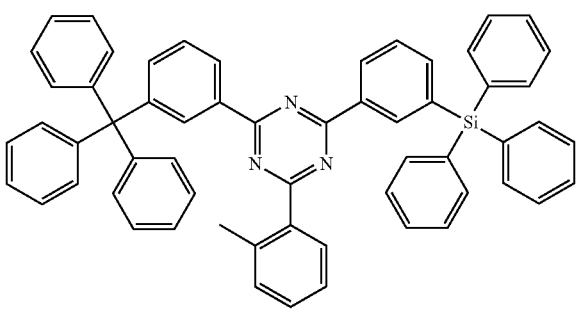

ETH3

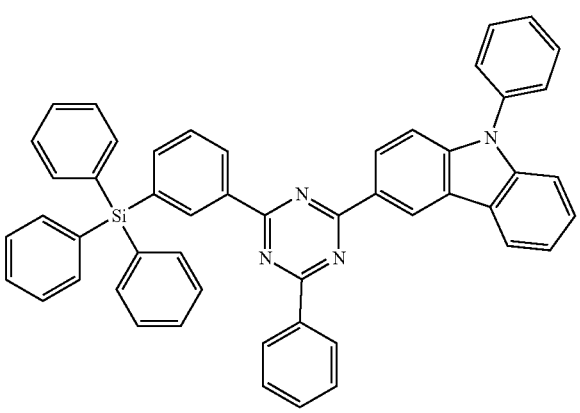

ETH4

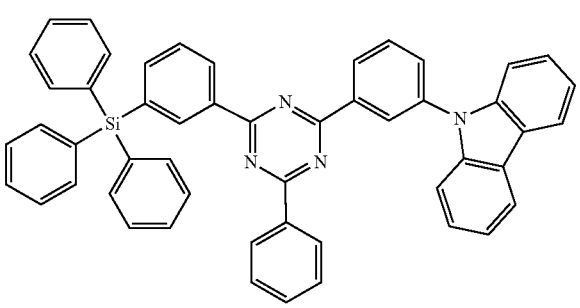

ETH5

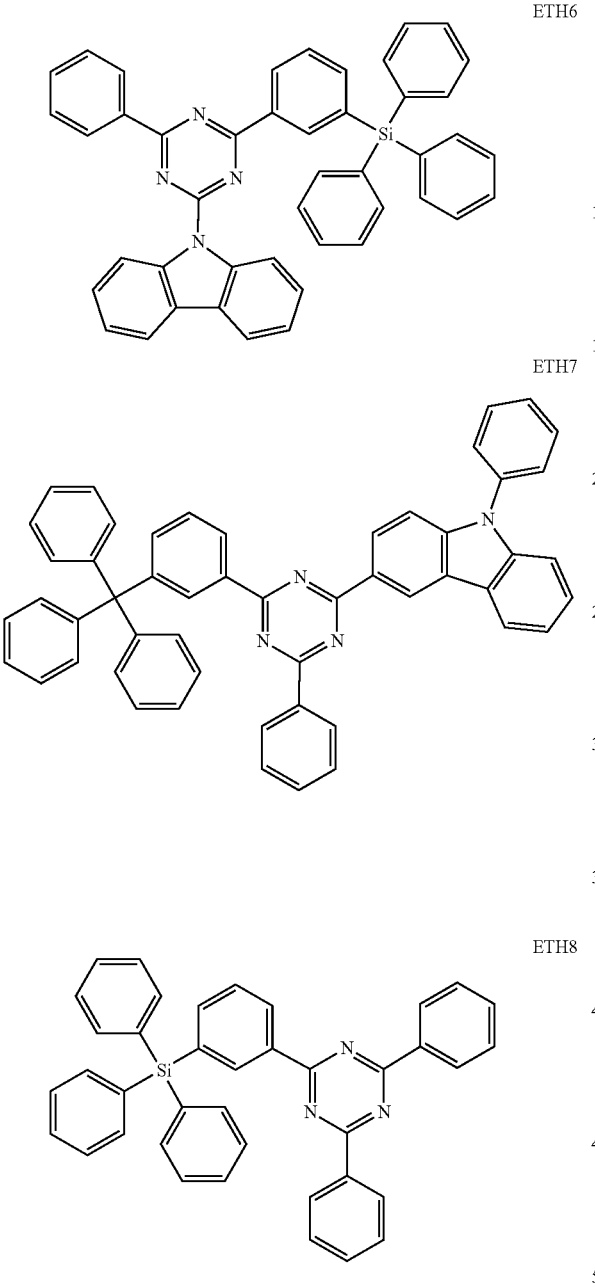

-continued

ETH13

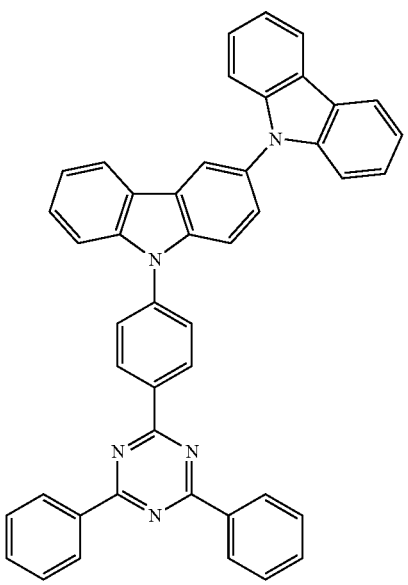

[Sensitizer]

The sensitizer may include an organometallic compound.

The sensitizer may not substantially emit light in the emission layer and transfer energy between the exciplex host and the delayed fluorescence dopant.

For example, singlet excitons of the exciplex may be transferred to the singlet state of the sensitizer by Förster energy transfer, and triplet excitons of the exciplex may be transferred to the triplet state of the sensitizer by Dexter energy transfer.

The sensitizer may transfer energy to the delayed fluorescence dopant. For example, the sensitizer may serve as an energy donor, and the delayed fluorescence dopant may serve as an energy acceptor. The mechanism of the sensitizer to transfer energy to the delayed fluorescence dopant may include both Förster energy transfer mechanism and Dexter energy transfer mechanism. Accordingly, energy transfer for emission in the emission layer may occur effectively.

As singlet excitons mostly transferred to triplet excitons through intersystem crossing, and the triplet excitons may be used in emission due to heavy atom effect of a metal atom, the sensitizer may effectively transfer the excitons transferred from the exciplex to the delayed fluorescence dopant.

An absolute PLQY of the sensitizer may be equal to or greater than about 80%. For example, an absolute PLQY of the sensitizer may be equal to or greater than about 90%. The absolute PLQY of the sensitizer may be obtained from a PL spectrum measured at room temperature of a thin film, in which a host material is doped with the sensitizer. The measurement of the absolute PLQY may be understood by referring to the descriptions of the Examples and Evaluation Examples.

In embodiments, the sensitizer may include an organometallic compound represented by Formula 3:

[Formula 3]

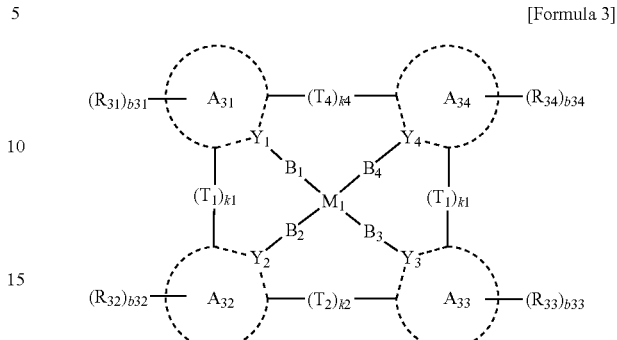

wherein, in Formula 3, $M_1$ may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

$Y_1$ to $Y_4$ may each independently be C, $A_{31}$ to $A_{34}$ may each independently be a $C_3$-$C_{60}$ carbocyclic group or a $C_1$-$C_{60}$ heterocyclic group, $B_1$ to $B_4$ may each independently be selected from a chemical bond, O, and S, $T_1$ to $T_4$ may each independently be *—O—*', *—C($R_{35}$)($R_{36}$)—*', *—C($R_{35}$)=*',*=C($R_{35}$)—*', *—C($R_{35}$)=C($R_{36}$)—*', *—C(=O)—*', *—C(=S)—*', *—C≡C—*', *—B($R_{35}$)—*', *—N($R_{35}$)—*',*—P($R_{35}$)—*', *—Si($R_{35}$)($R_{36}$)—*', *—P(=O)($R_{35}$)—*', or *—Ge($R_{35}$)($R_{36}$)—*', k1 to k4 may each independently be an integer from 0 to 3, and a sum of k1 to k4 may be equal to or greater than 3, $R_{31}$ to $R_{36}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and b31 to b34 may each independently be an integer from 1 to 5, at least two adjacent groups of $R_{31}$(s) in the number of b31, $R_{32}$(s) in the number of b32, $R_{33}$(s) in the number of b33, $R_{34}$(s) in the number of b34, $R_{35}$, and $R_{36}$ may optionally be bound to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and and *' each indicate a binding site to an adjacent atom.

$R_{10a}$ and $Q_1$ to $Q_3$ may respectively be understood by referring to the descriptions thereof provided herein.

In embodiments, at least one of $A_{31}$ to $A_{34}$ may be a $C_1$-$C_{60}$ heterocyclic group in which a site of coordination with metal $M_1$ is a carbene moiety.

In embodiments, at least one of $A_{31}$ to $A_{34}$ may be a group represented by Formula 3A-1 or Formula 3A-2:

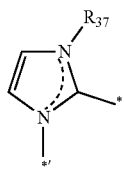

3A-1

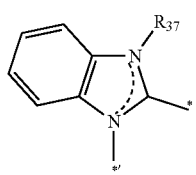

3A-2 wherein, in Formulae 3A-1 and 3A-2, $R_{37}$ may be understood by referring to the description of $R_{31}$,

* indicates a binding site to $M_1$, and

*' indicates a binding site to an adjacent atom.

In embodiments, the sensitizer may include at least one of Compounds Pt-1 to Pt-16, but embodiments are not limited thereto:

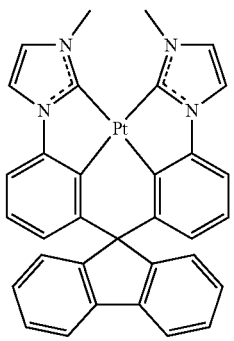

Pt-1

Pt-2

Pt-3

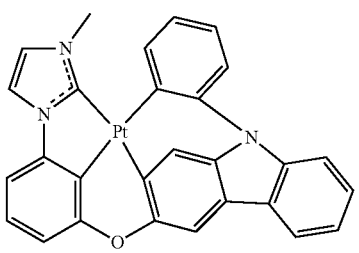

Pt-4

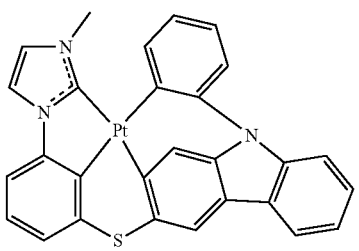

Pt-5

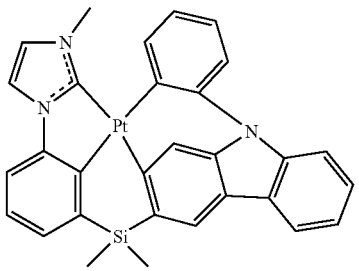

Pt-6

Pt-7

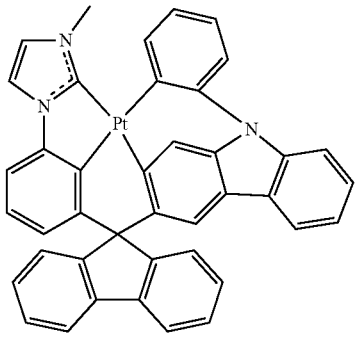

Pt-8

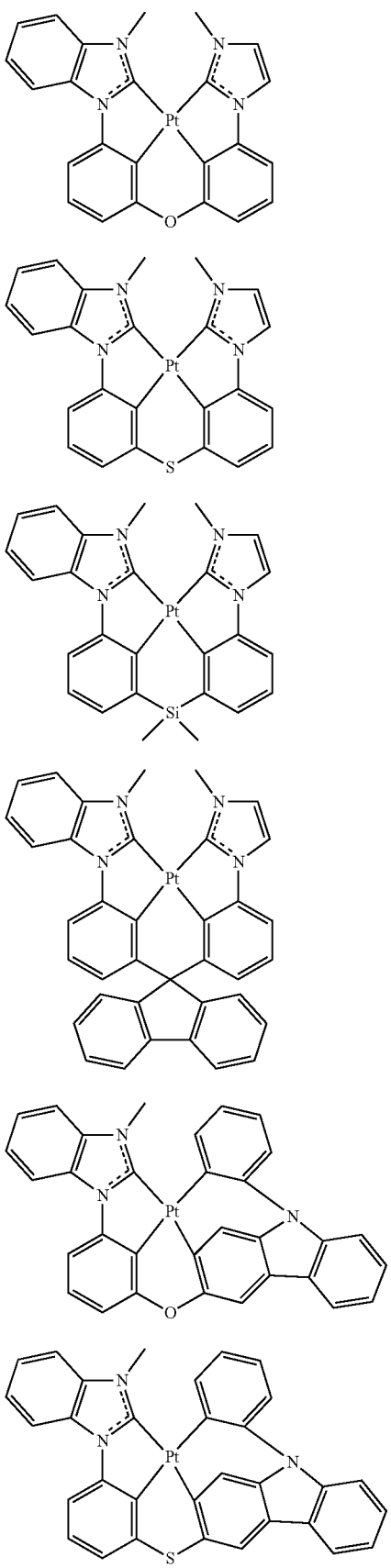

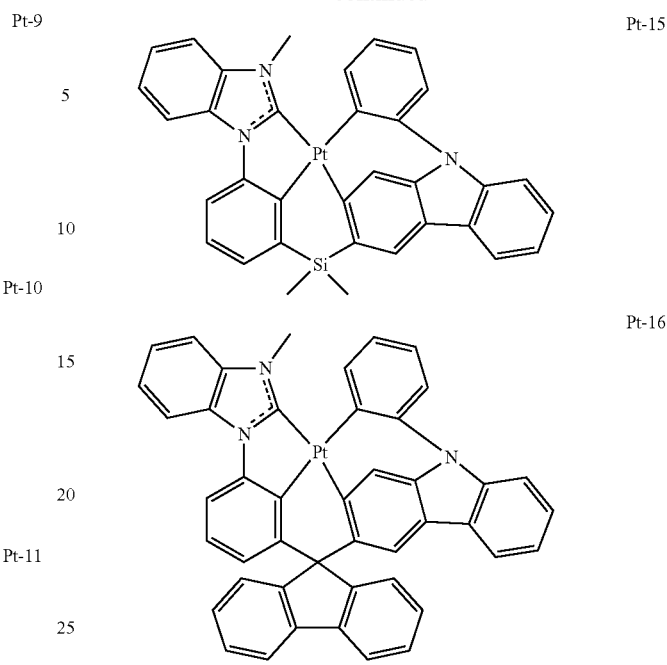

[Delayed Fluorescence Dopant]

The delayed fluorescence dopant may be any suitable compound that may emit delayed fluorescence according to a delayed fluorescence emission mechanism.

As triplet excitons are transferred to a singlet state through RISC, and the excitons in a singlet state are transferred to a ground state, the delayed fluorescence dopant may emit delayed fluorescence. Accordingly, the delayed fluorescence dopant may have 100% of internal quantum yield theoretically.

For example, the delayed fluorescence dopant may be a thermally activated delayed fluorescence dopant.

In embodiments, the delayed fluorescence dopant may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

In embodiments, the delayed fluorescence dopant may include a condensed-cyclic compound represented by Formula 4:

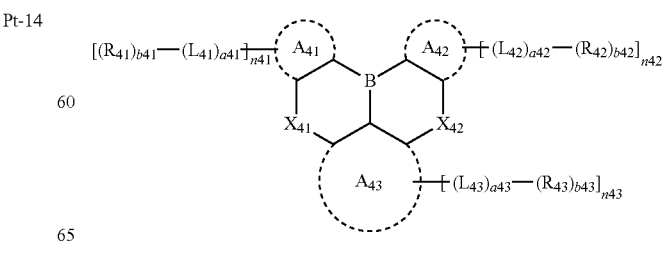

wherein, in Formula 4,

A$_{41}$ to A$_{43}$ may each independently be a C$_3$-C$_{60}$ carbocyclic group or a C$_1$-C$_{60}$ heterocyclic group, X$_{41}$ may be C(R$_{44}$)(R$_{45}$), N(R$_{44}$), O, or S, X$_{42}$ may be C(R$_{46}$)(R$_{47}$), N(R$_{46}$), O, or S, L$_{41}$ to L$_{43}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, a41 to a43 may each independently be an integer from 0 to 5, R$_{41}$ to R$_{47}$ may each independently be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, a C$_6$-C$_{60}$ aryloxy group unsubstituted or substituted with at least one R$_{10a}$, a C$_6$-C$_{60}$ arylthio group unsubstituted or substituted with at least one R$_{10a}$, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), and b41 to b43 and n41 to n43 may each independently be an integer from 1 to 5.

R$_{10a}$ and Q$_1$ to Q$_3$ may respectively be understood by referring to the descriptions thereof provided herein.

In embodiments, the delayed fluorescence dopant may be a condensed-cyclic compound represented by Formula 4-1:

[Formula 4-1]

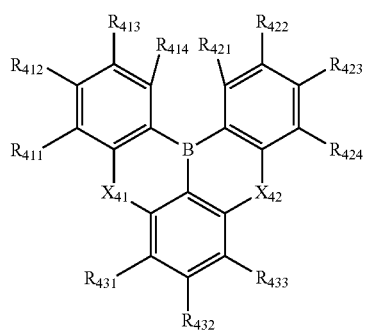

wherein, in Formula 4-1,

R$_{411}$ to R$_{414}$ may each independently be understood by referring to the description of R$_{41}$, R$_{421}$ to R$_{424}$ may each independently be understood by referring to the description of R$_{42}$, R$_{431}$ to R$_{433}$ may each independently be understood by referring to the description of R$_{43}$, and X$_{41}$ and X$_{42}$ may respectively be understood by referring to the descriptions of X$_{41}$ and X$_{42}$ provided herein.

For example, the delayed fluorescence dopant may include at least one of Compounds D1 to D12, but embodiments are not limited thereto:

D1

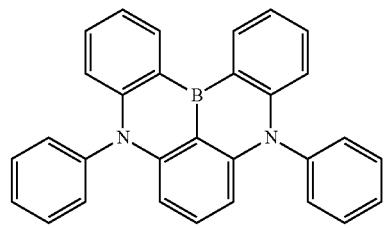

D2

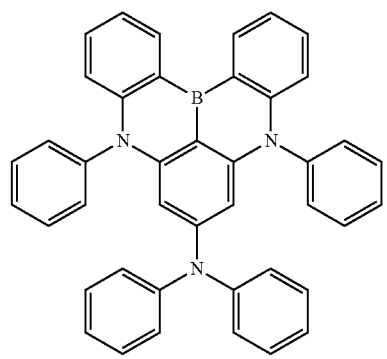

D3

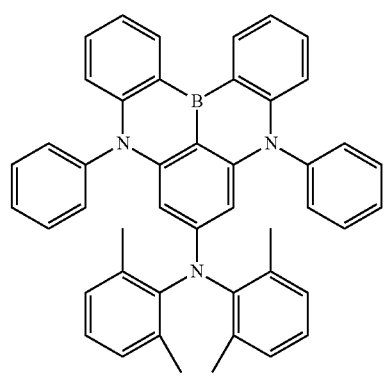

D4

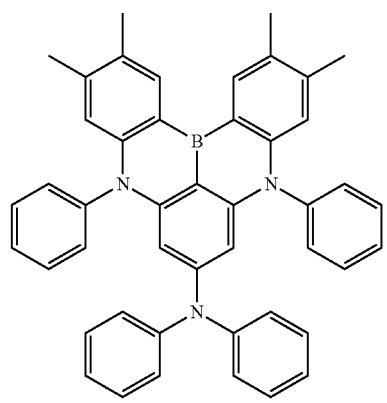

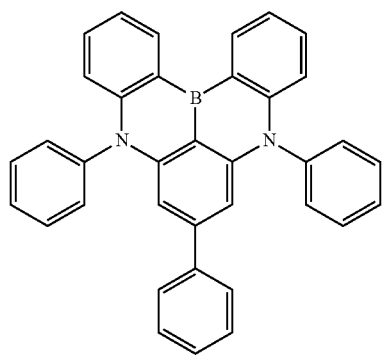
D5
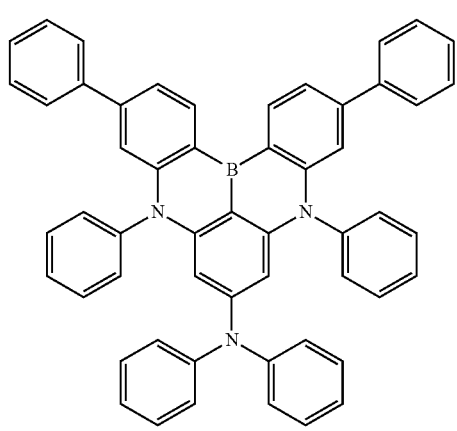
D8
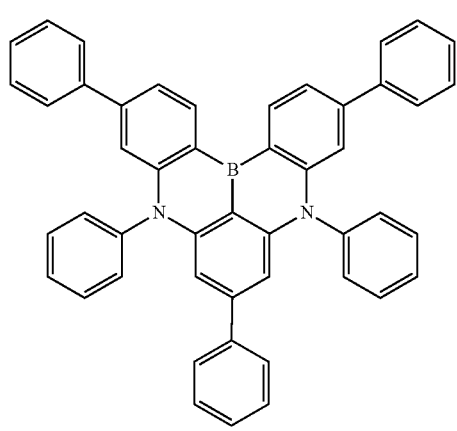
D6
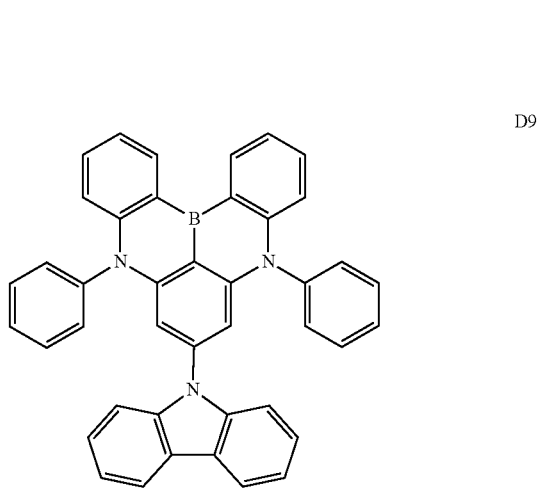
D9
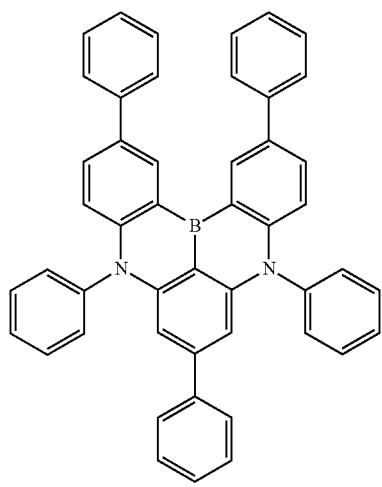
D7
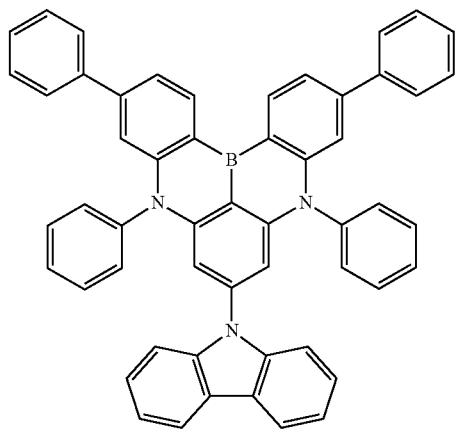
D10

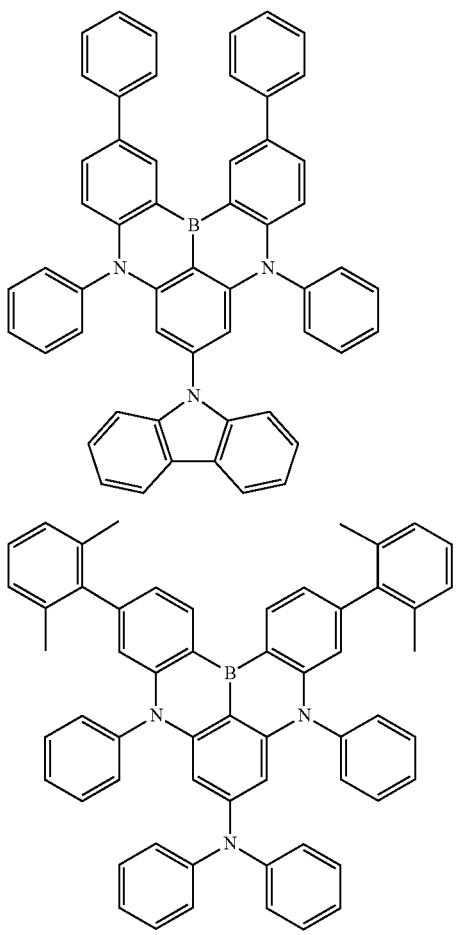

D11

D12

The condensed-cyclic compound represented by Formula 4 or Formula 4-1 may be a structure in which cyclic groups are condensed around a central boron atom, and thus, structural flexibility of the compound may be low, and changes in geometry may be small. Thus, the condensed-cyclic compound may have small Stoke's shift characteristics, thus having a small full width of half maximum (FWHM). Accordingly, a light-emitting device using the condensed-cyclic compound as an emission dopant may have improved colorimetric purity and color reproducibility, as compared with a light-emitting device using a sensitizer as an emission dopant.

Figure 2:
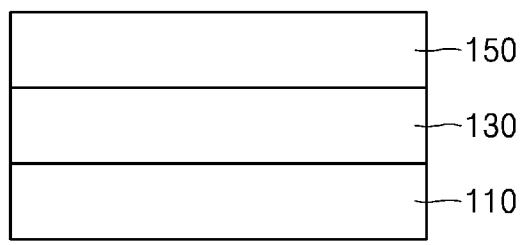
FIG. 2 is a schematic cross-sectional view of a light-emitting device according to an embodiment.

[Description of FIG. 2]

FIG. 2 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 2.

[First Electrode 110]

Referring to FIG. 2, a substrate may be additionally disposed under the first electrode 110 or on the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphtalate, polyarylate (PAR), polyetherimide, or any combination thereof.

The first electrode 110 may be formed by depositing or sputtering, onto the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including two or more layers. In embodiments, the first electrode 110 may have a triple-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and the charge generation layer, the light-emitting device 10 may be a tandem light-emitting device.

[Hole Transport Region in Interlayer 130]

The hole transport region may have i) a single-layered structure consisting of a single layer consisting of a single material, ii) a single-layered structure consisting of a single layer including different materials, or iii) a multi-layered structure having multiple layers including different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are stacked on the first electrode 110 in each stated order.

The hole transport region may include the compound represented by Formula 201, the compound represented by Formula 202, or any combination thereof:

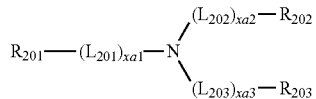

[Formula 201]

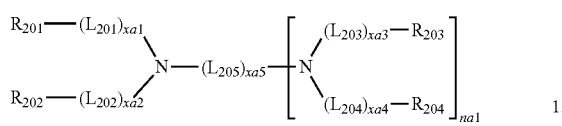

[Formula 202]

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In embodiments, Formulae 201 and 202 may each include at least one of groups represented by Formulae CY201 to CY217:

CY201

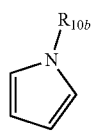

CY202

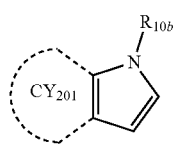

CY203

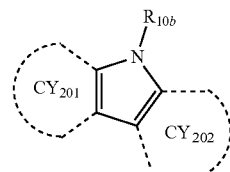

CY204

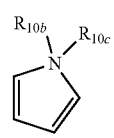

CY205

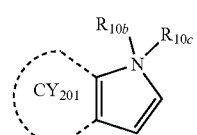

CY206

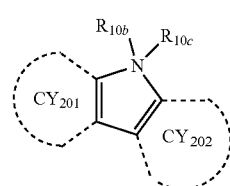

CY207

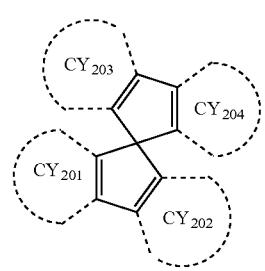

CY208

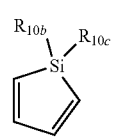

CY201 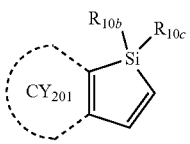

CY202 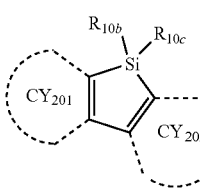

CY203 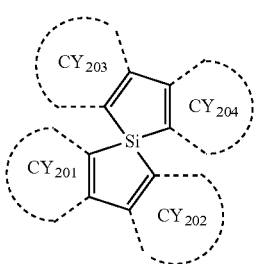

CY209 

CY210 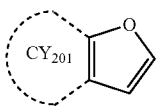

CY211 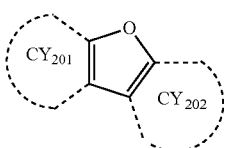

CY212 

CY213 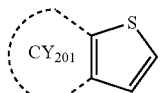

CY214 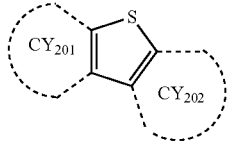

CY215

CY216

CY217 wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, in Formulae CY201 to CY217, ring $CY_{201}$ to ring $CY_{204}$ may each independently be a benzene group, a naphthalene group, a phenanthrene group, or an anthracene group.

In embodiments, Formulae 201 and 202 may each include at least one of groups represented by Formula CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In embodiments, Formula 201 and 202 may each not include groups represented by Formulae CY201 to CY203.

In embodiments, Formula 201 and 202 may each not include groups represented by Formulae CY201 to CY203, and include at least one of groups represented by Formulae CY204 to CY217.

In embodiments, Formula 201 and 202 may each not include groups represented by Formulae CY201 to CY217.

In embodiments, the hole transport region may include one of Compounds HT1 to HT44 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), or any combination thereof:

HT1
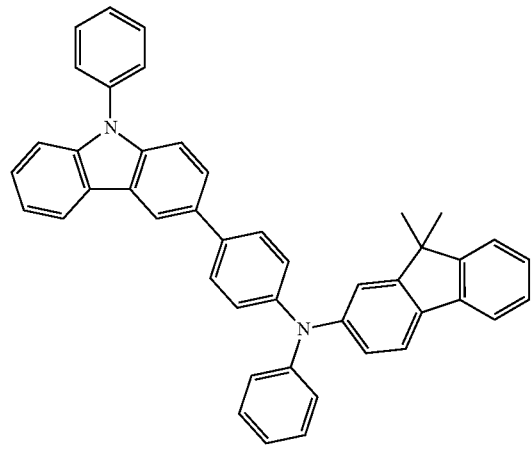
HT2
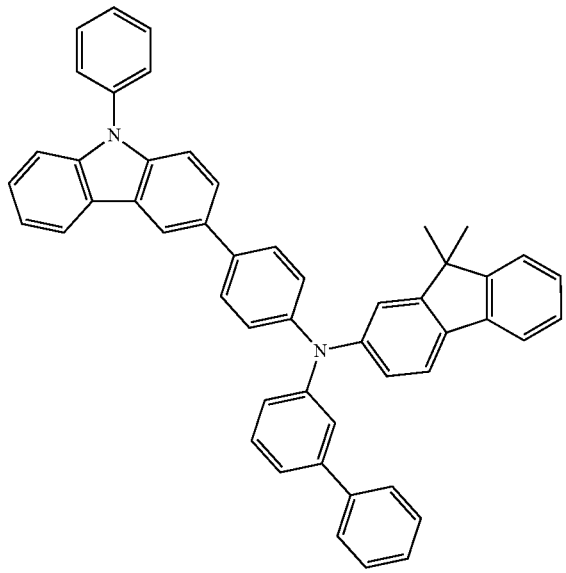
HT3
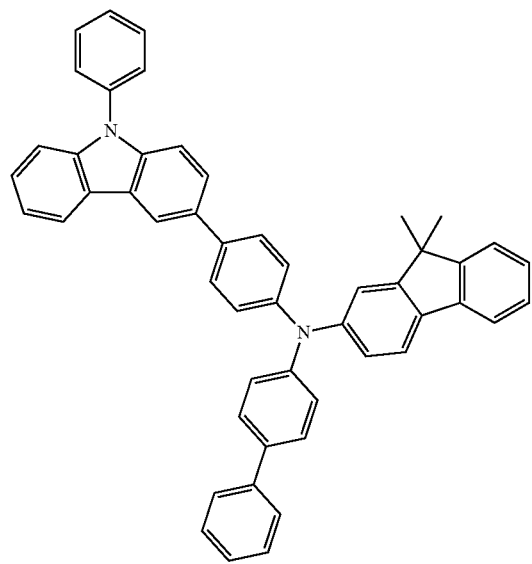
HT4
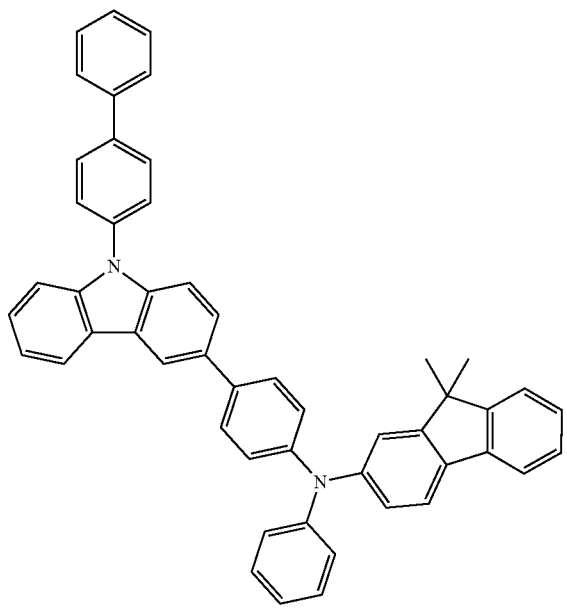

-continued
HT5
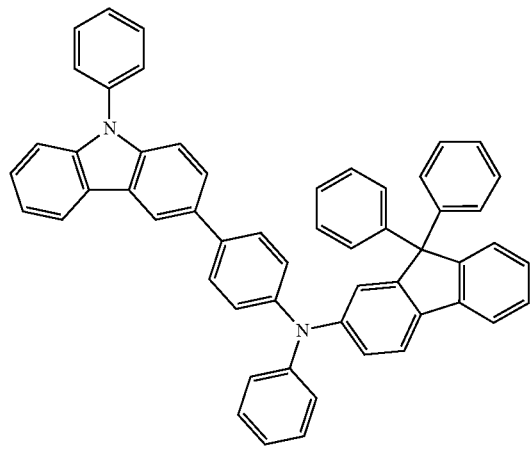
HT6
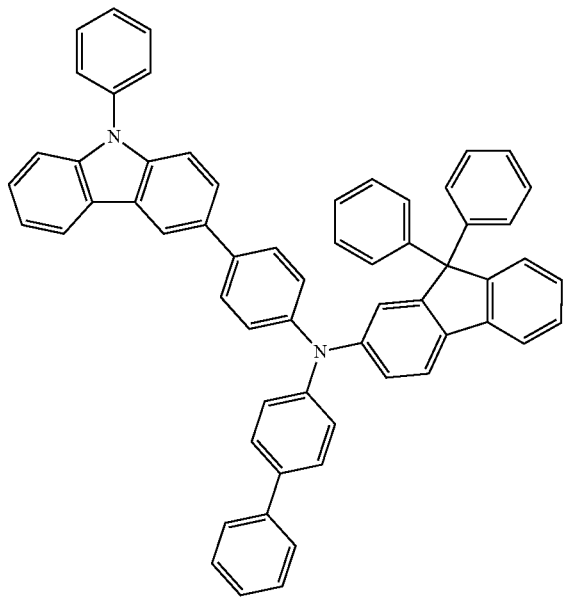
HT7
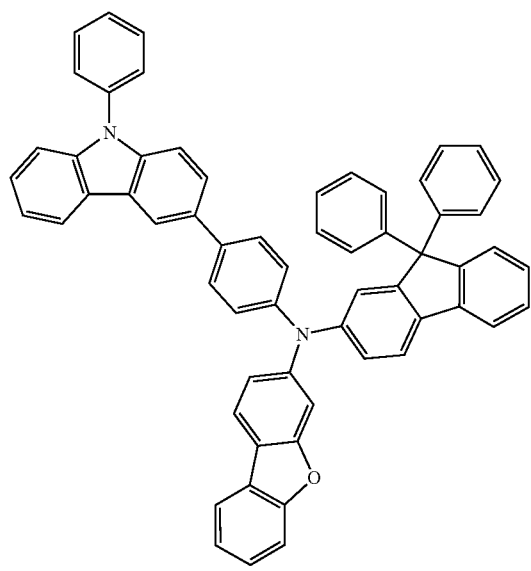
HT8
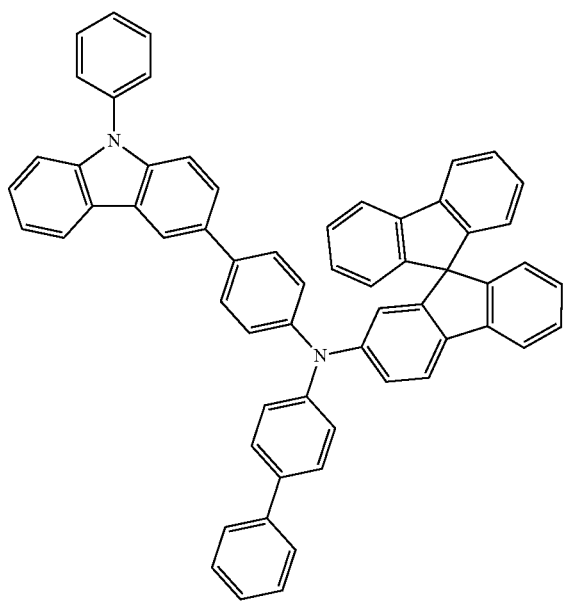

HT9
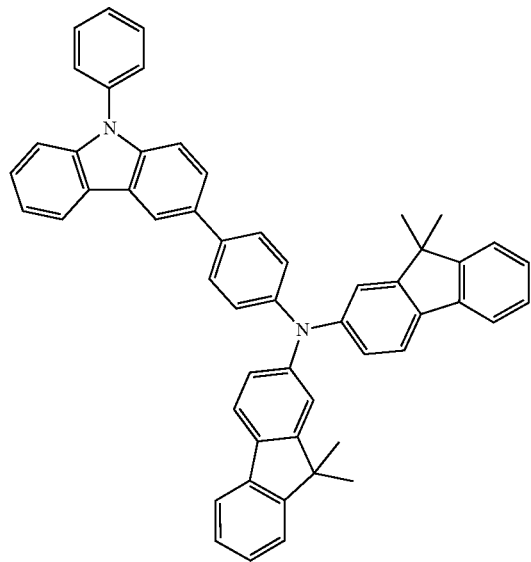
HT10
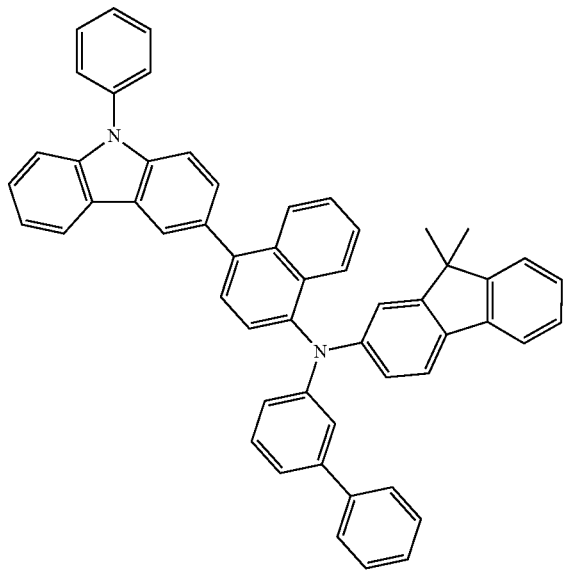
HT11
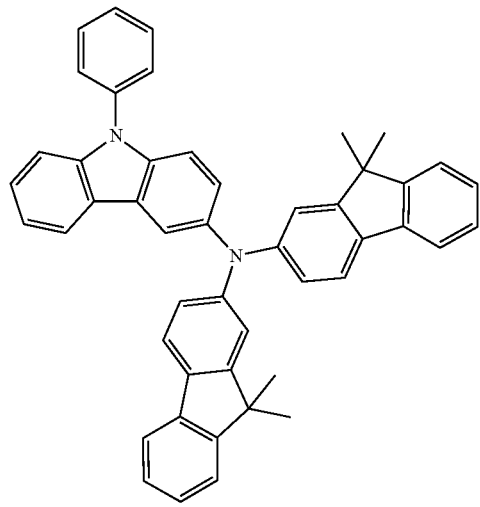
HT12
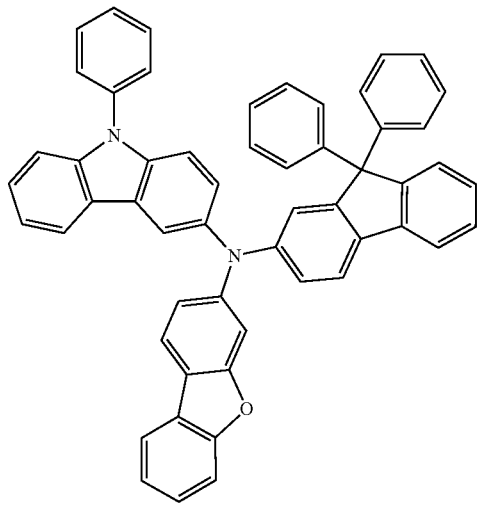

-continued
HT13
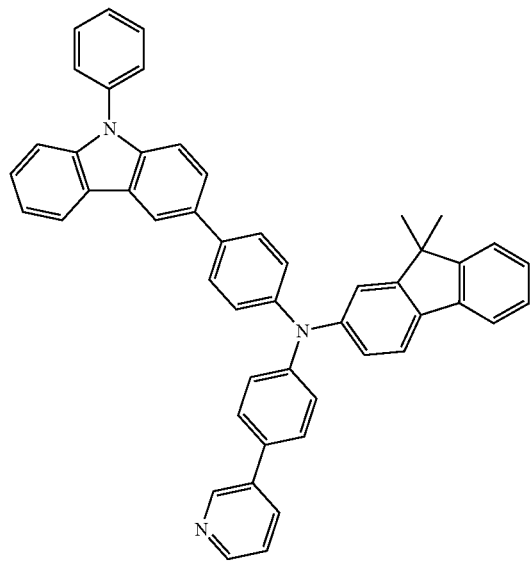
HT14
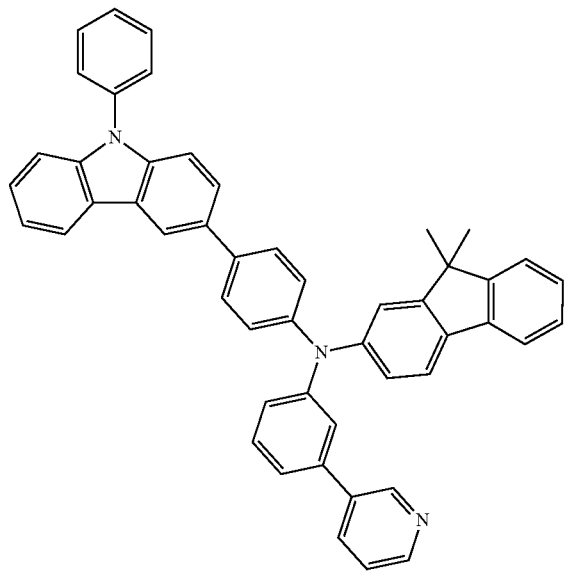
HT15
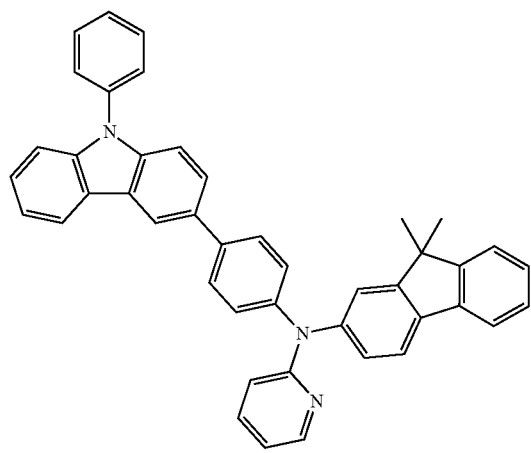
HT16
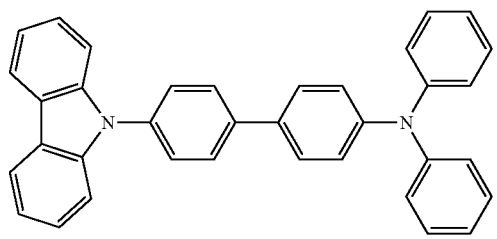
HT17
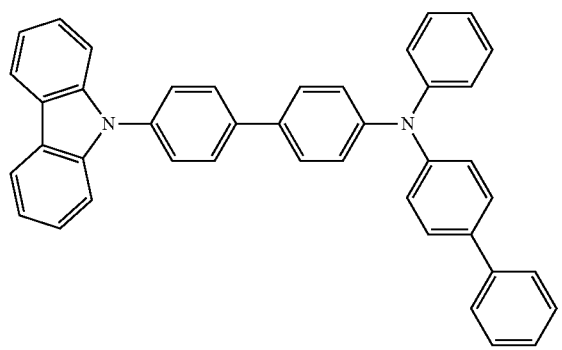
HT18
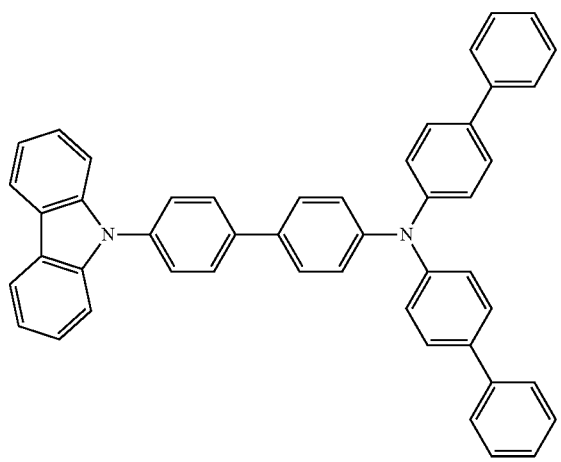

HT19
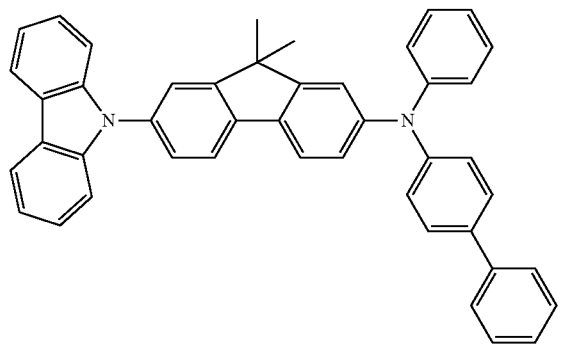
HT20 HT21
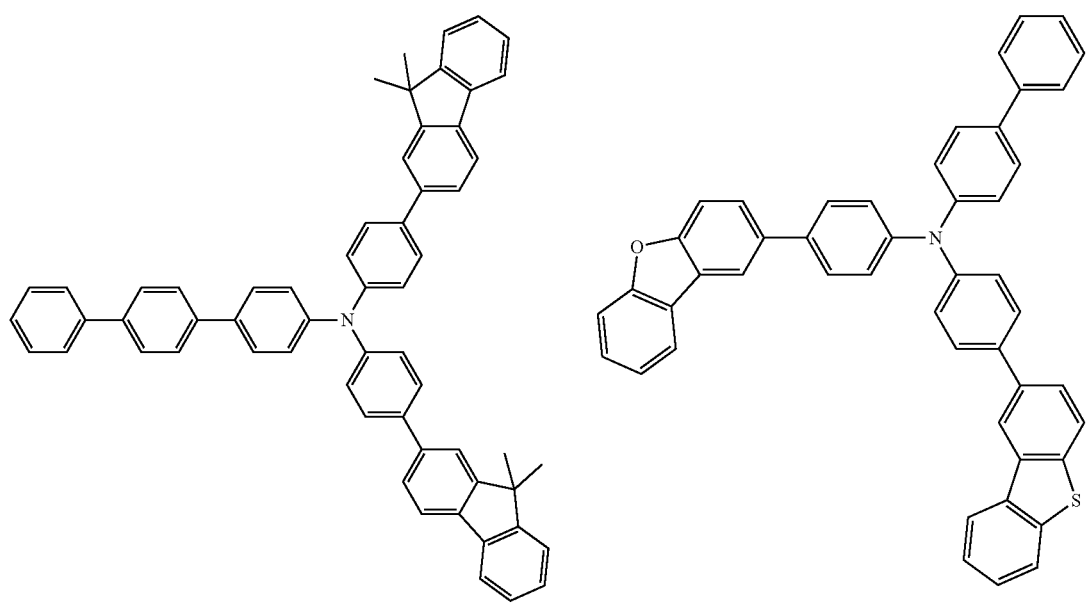
HT22
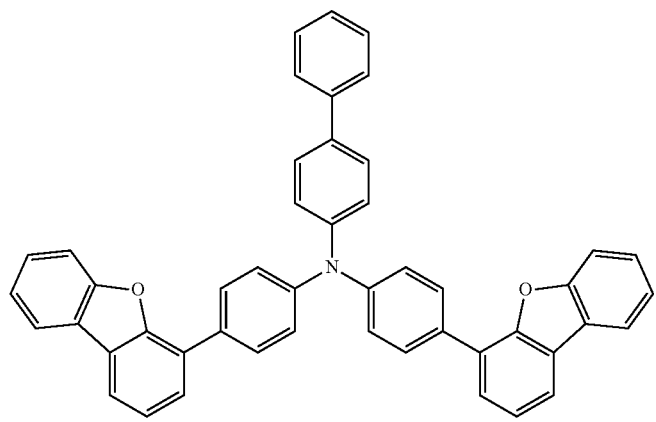

-continued
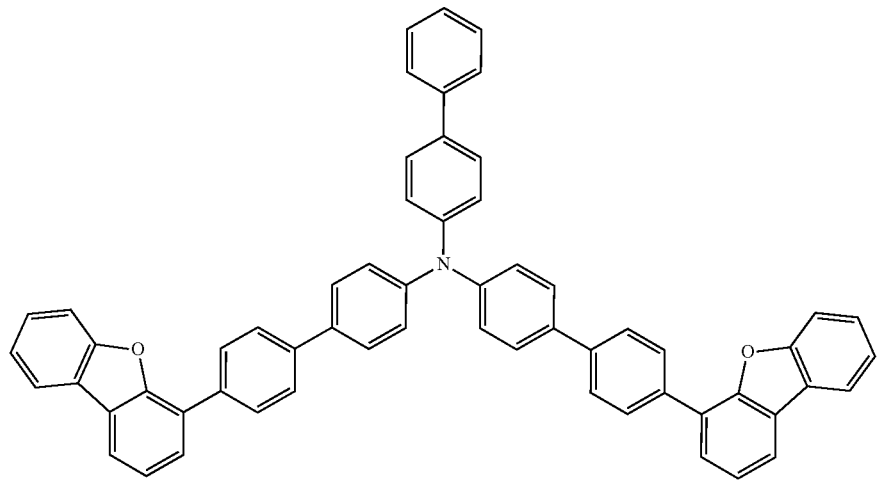
HT23
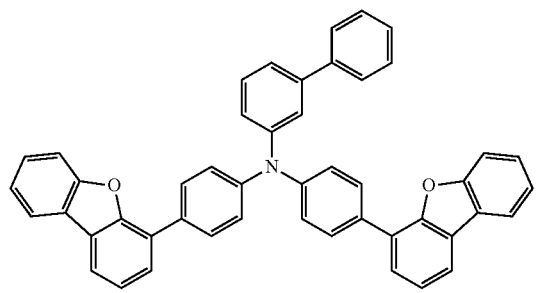
HT24
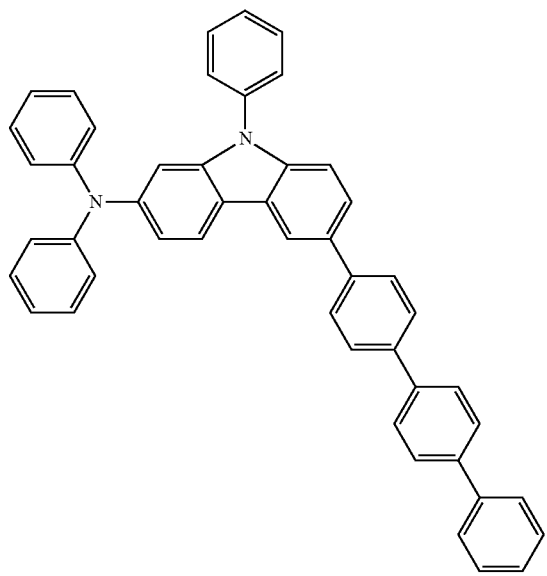
HT25
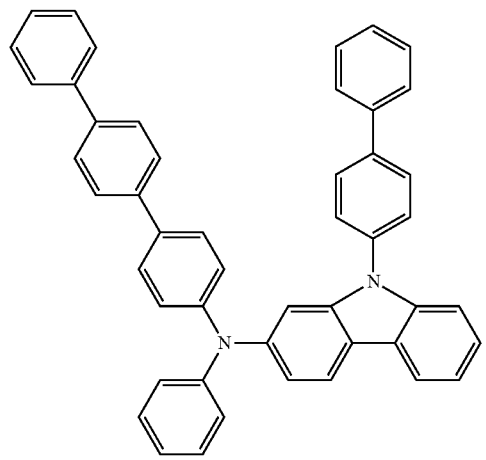
HT26
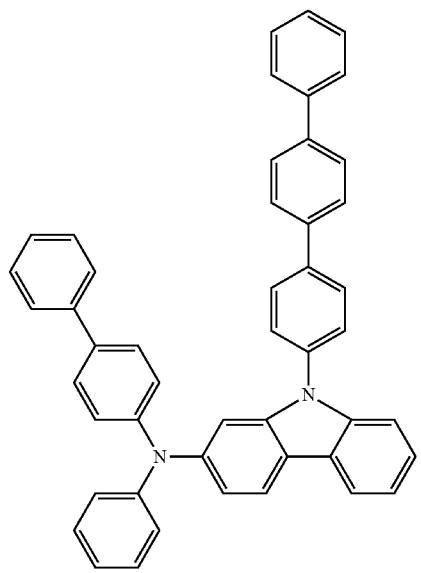
HT27

-continued
HT28
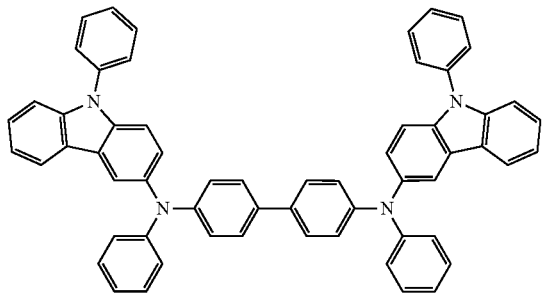
HT29
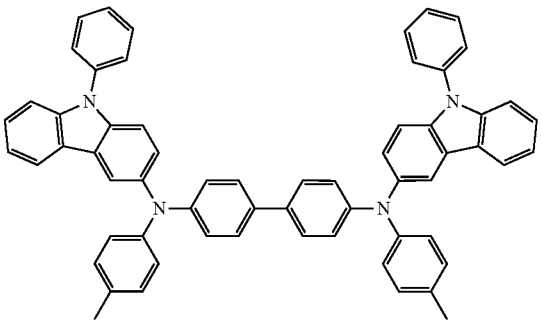
HT30
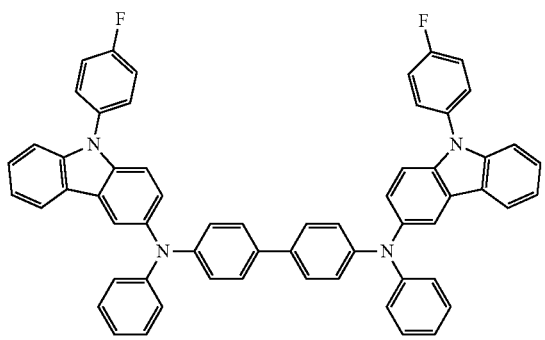
HT31
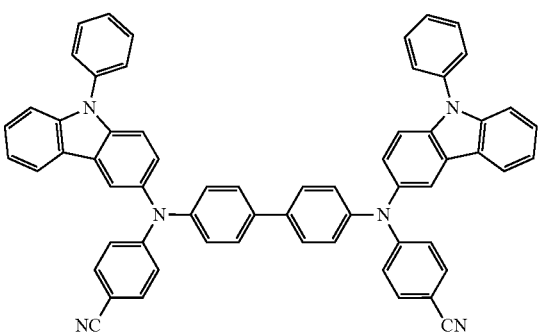
HT32
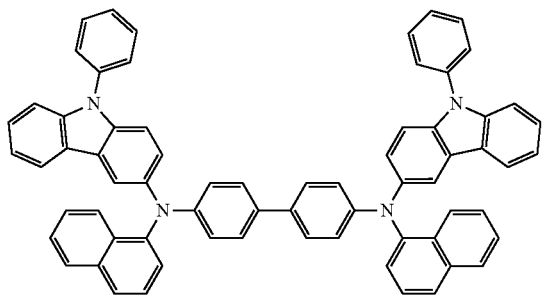
HT33
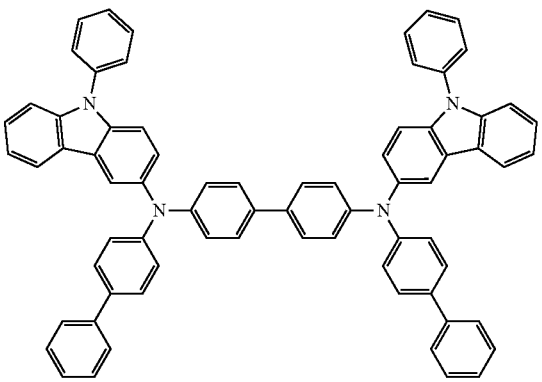
HT34
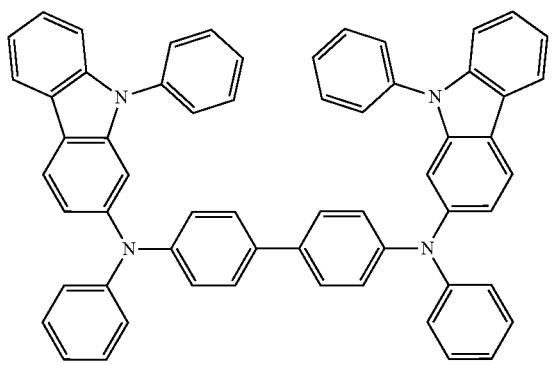
HT35
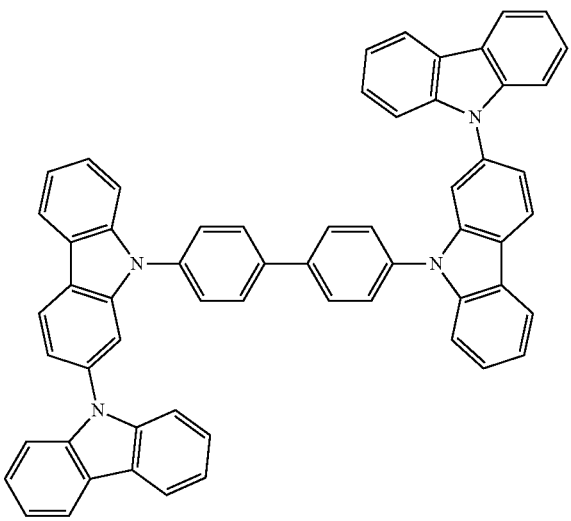

-continued
HT36
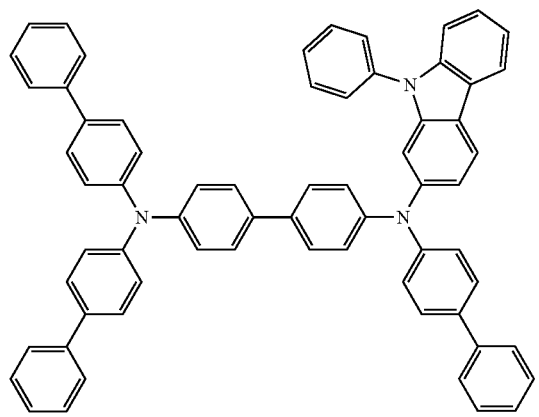
HT37
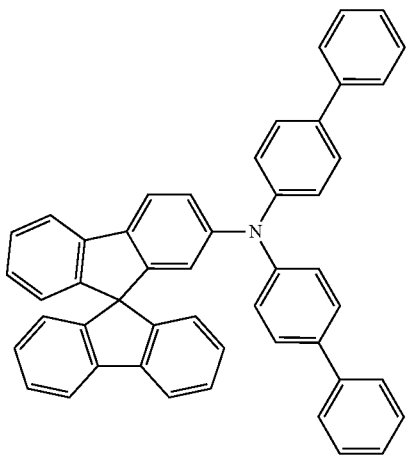
HT38
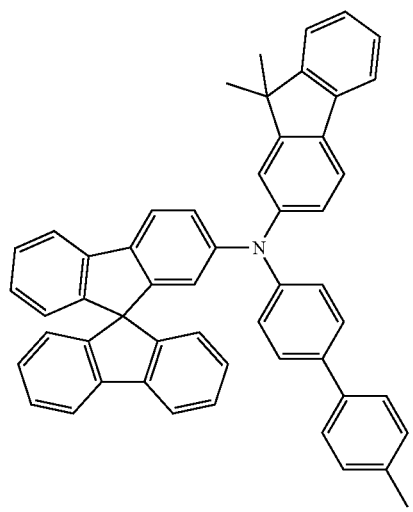
HT39
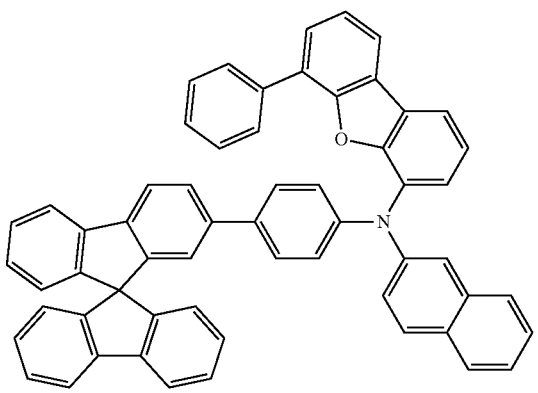
HT40
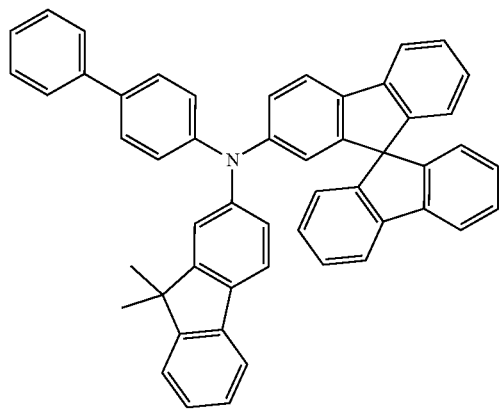
HT41
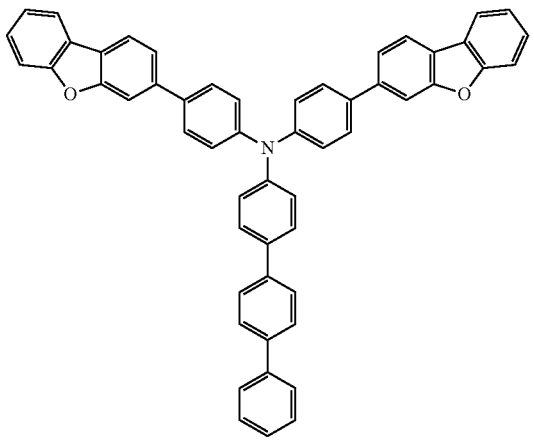

-continued
HT42
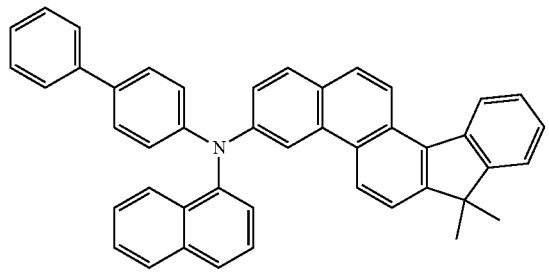
HT43
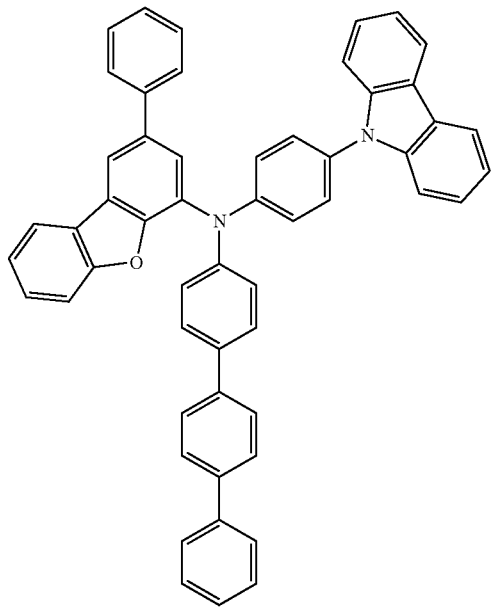
HT44
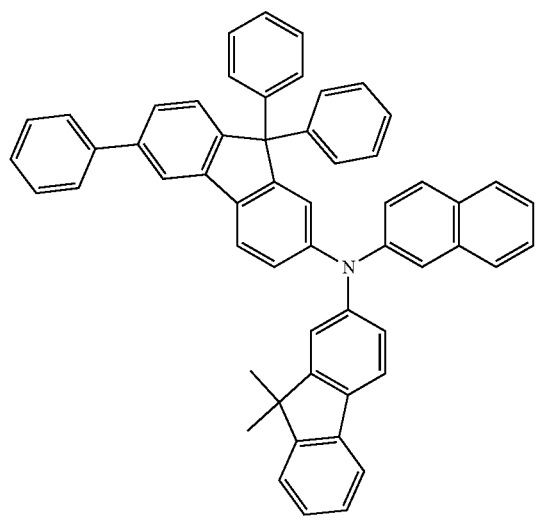
m-MTDATA
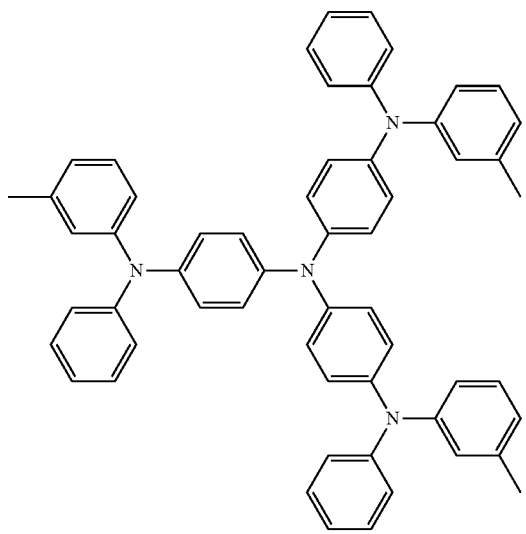

-continued
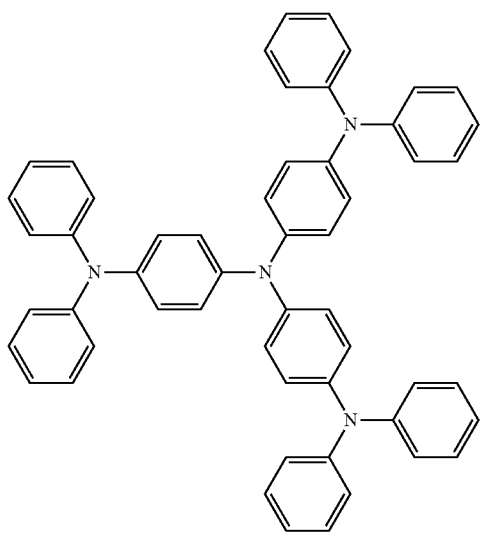
TDATA
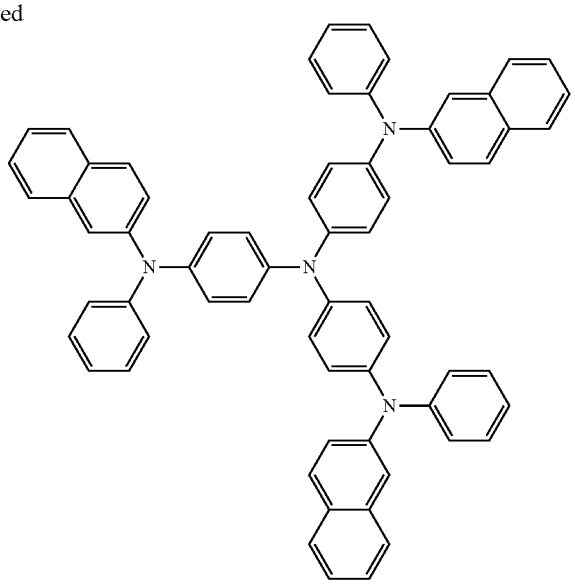
2-TNATA
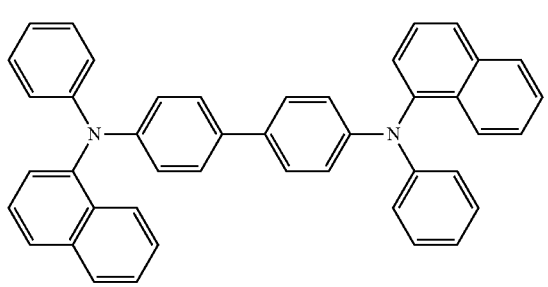
NPB
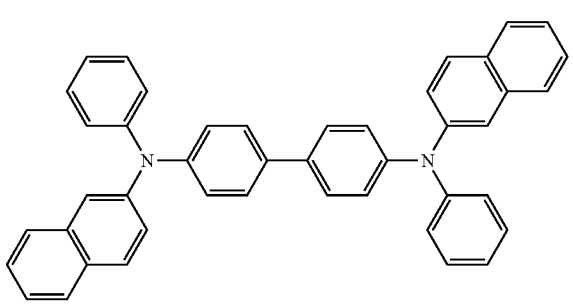
β-NPB
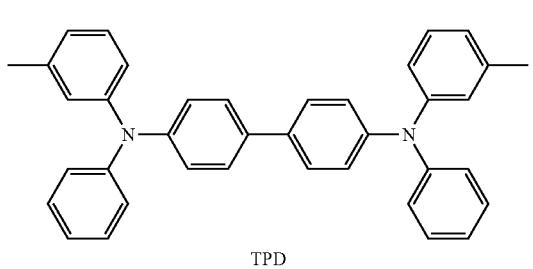
TPD
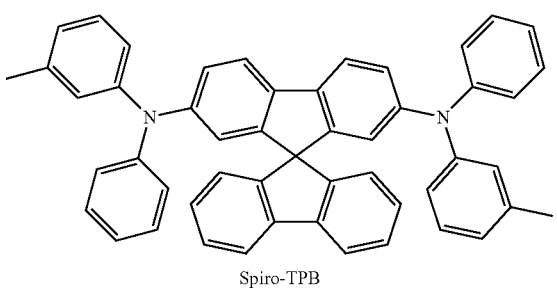
Spiro-TPB
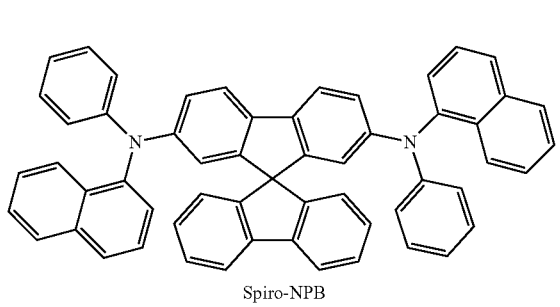
Spiro-NPB
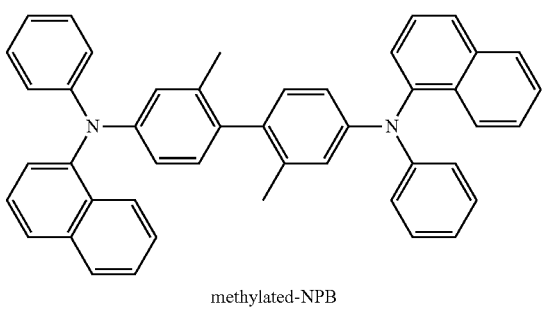
methylated-NPB

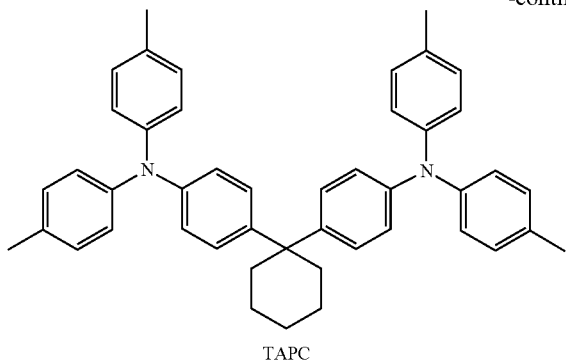

TAPC

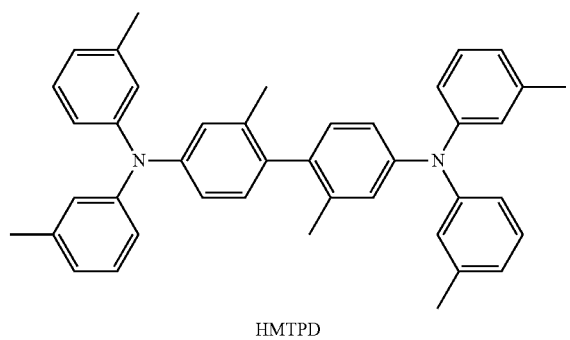

HMTPD

A thickness of the hole transport region may be in a range of about 50 (Angstroms) Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

[p-Dopant]

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a cyano group-containing compound, elements EL1 and EL2-containing compound, or any combination thereof.

Examples of the quinone derivative may include TCNQ, F4-TCNQ, and the like.

Examples of the cyano group-containing compound include HAT-CN, a compound represented by Formula 221, and the like:

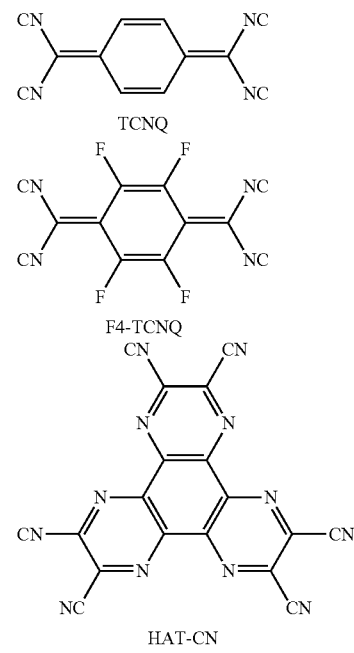

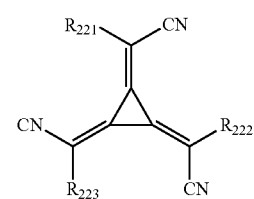

[Formula 221]

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and EL2-containing compound, element EL1 may be metal, metalloid, or a combination thereof, and element EL2 may be non-metal, metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the elements EL1 and EL2-containing compound may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (e.g., $ReO_3$, and the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_{13}$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

[Emission Layer in Interlayer 130]

When the light-emitting device 10 is a full color light-emitting device, the emission layer may be patterned into a red emission layer, a green emission layer, and/or a blue emission layer, according to a sub-pixel. In embodiments, the emission layer may have a stacked structure. The stacked structure may include two or more layers selected from a red emission layer, a green emission layer, and a blue emission layer. The two or more layers may be in direct contact with each other. In embodiments, the two or more layers may be separated from each other. In embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a hole transporting host, an electron transporting host, a sensitizer, and a delayed fluorescence dopant, which may satisfy the conditions described herein.

An amount of the sensitizer in the emission layer may be, for example, in a range of about 1 part to about 30 parts by weight, based on 100 parts by weight of the host. For example, the amount of the sensitizer in the emission layer may be in a range of about 10 parts to about 15 parts by weight, based on 100 parts by weight of the host.

An amount of the delayed fluorescence dopant in the emission layer may be, for example, in a range of about 0.1 parts to about 30 parts by weight, based on 100 parts by weight of the host. For example, the amount of the delayed fluorescence dopant in the emission layer may be in a range of about 0.2 parts to about 10 parts by weight, based on 100 parts by weight of the host. For example, the amount of the delayed fluorescence dopant in the emission layer may be in a range of about 0.3 parts to about 1 part based on 100 parts by weight of the host.

A thickness of the emission layer may be in a range of about 100 Å to about 1,000 Å. For example, the thickness of the emission layer may be in a range of about 200 Å to about 600 Å. When the thickness of the emission layer is within any of these ranges, improved luminescence characteristics may be obtained without a substantial increase in driving voltage.

In embodiments, the emission layer may emit blue light.

For example, the emission layer may emit blue light having a maximum emission wavelength in a range of about 450 nm to about 470 nm.

[Electron Transport Region in Interlayer 130]

The electron transport region may have i) a single-layered structure consisting of a single layer consisting of a single material, ii) a single-layered structure consisting of a single layer including different materials, or iii) a multi-layered structure having multiple layers including different materials.

The electron transport region may include a buffer layer, a hole blocking layer, an electron control layer, an electron transport layer, or an electron injection layer.

In embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are stacked on the emission layer in each stated order.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

$$[Ar_{601}]_{xe11}-[(L_{601})_{xe1}-R_{601}]_{xe21}$$ [Formula 601]

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

In embodiments, when xe11 in Formula 601 is 2 or greater, at least two $Ar_{601}$(s) may be bound via a single bond.

In embodiments, in Formula 601, $Ar_{601}$ may be a substituted or unsubstituted anthracene group.

In embodiments, the electron transport region may include a compound represented by Formula 601-1:

[Formula 601-1]

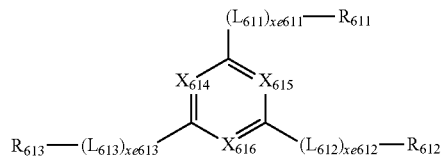

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

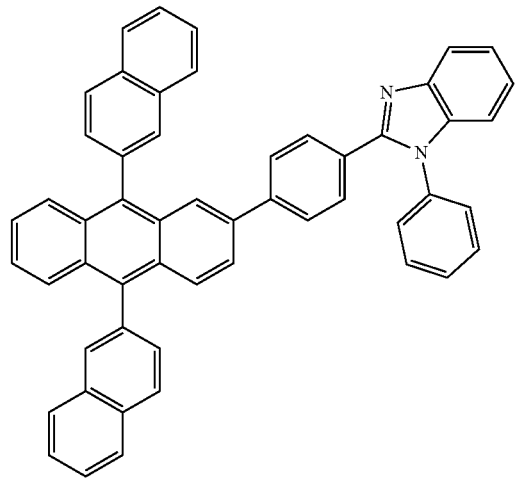

ET2
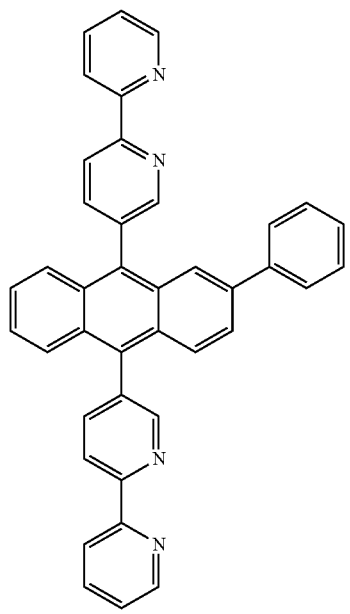
ET3
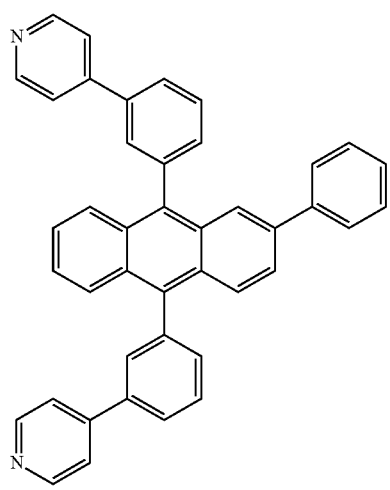
ET4
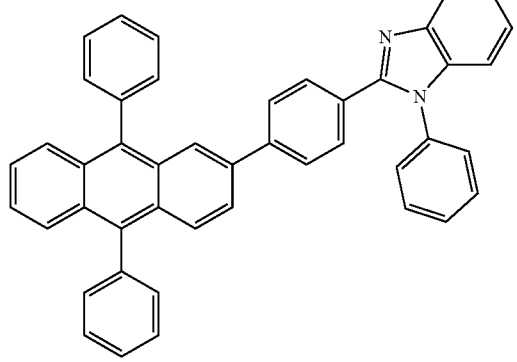
ET5
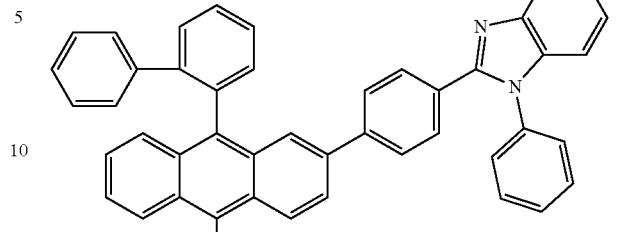
ET6
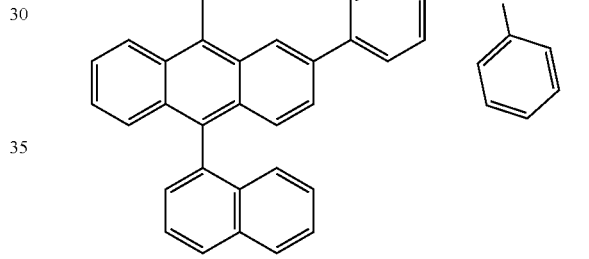
ET7
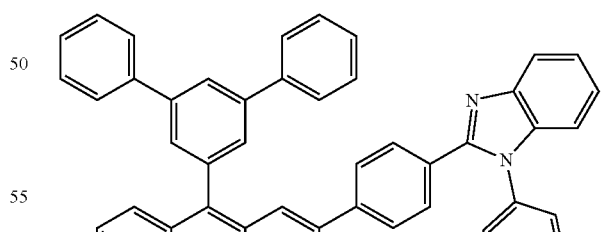

-continued
ET8
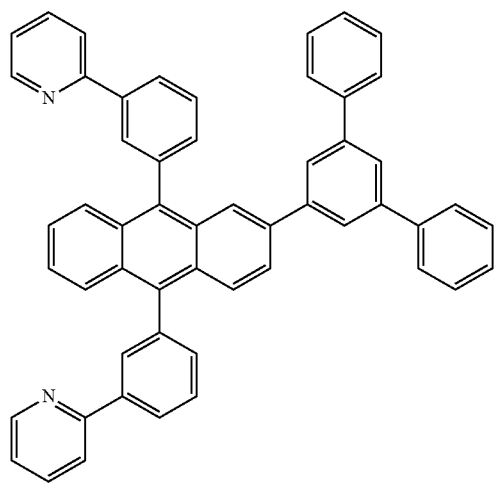
ET9
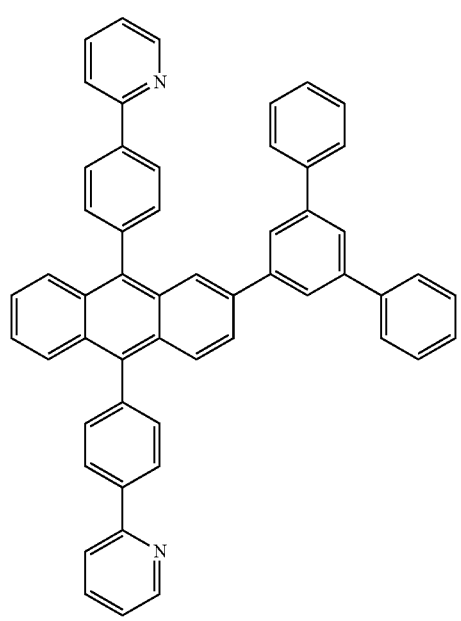
ET10
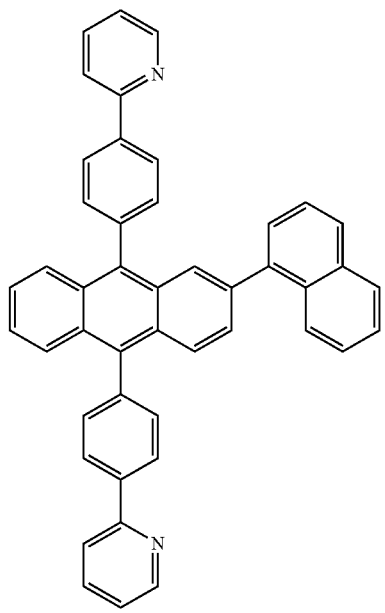
ET11
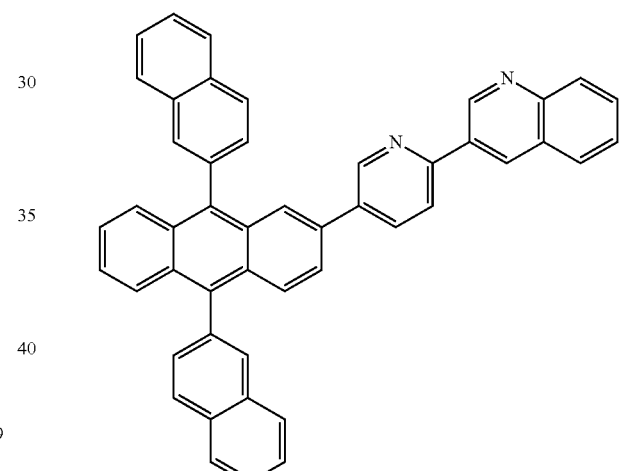
ET12
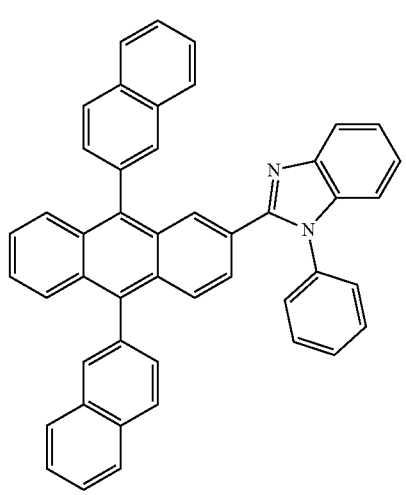

ET13
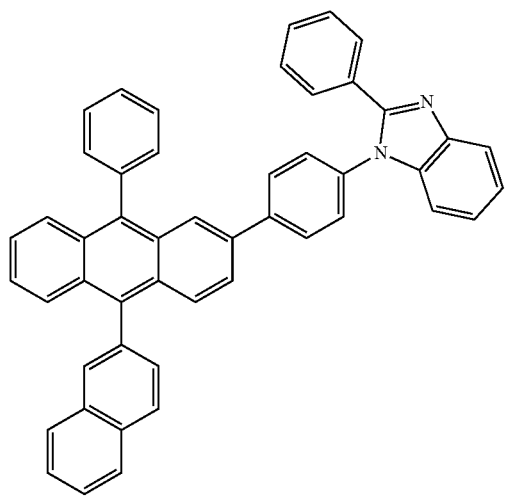
ET14
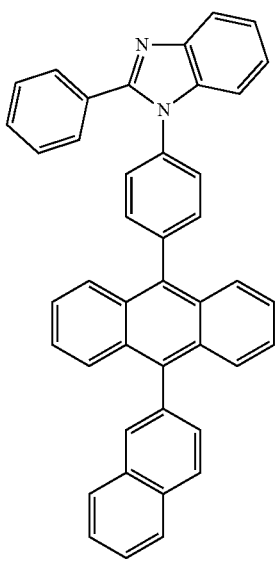
ET15
ET16
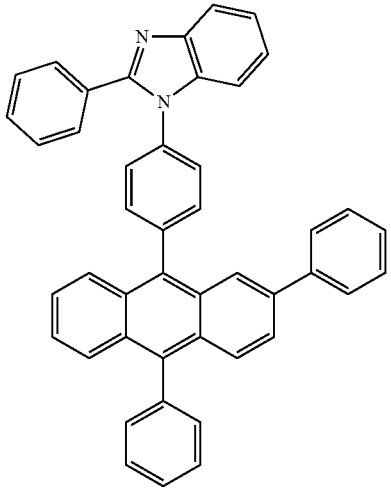
ET17
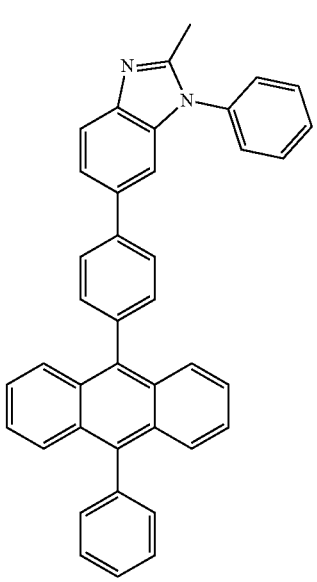
ET18

-continued
ET19
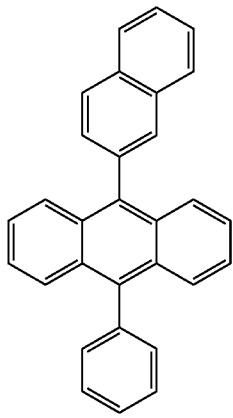
ET20
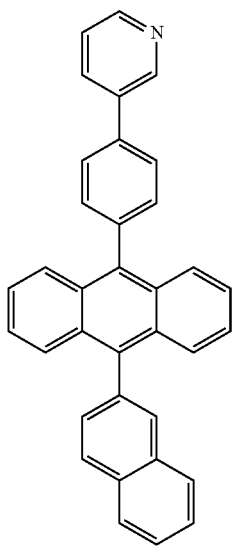
ET21
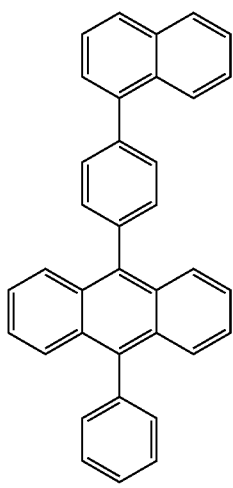
-continued
ET22
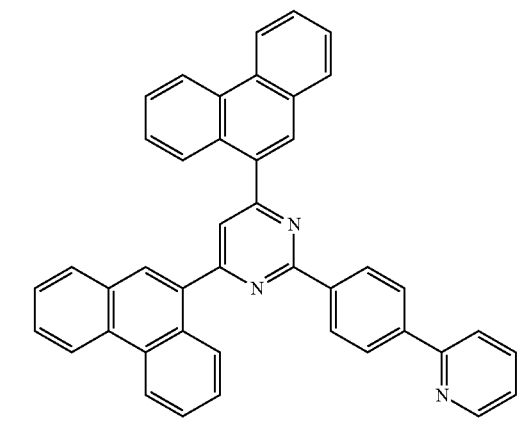
ET23
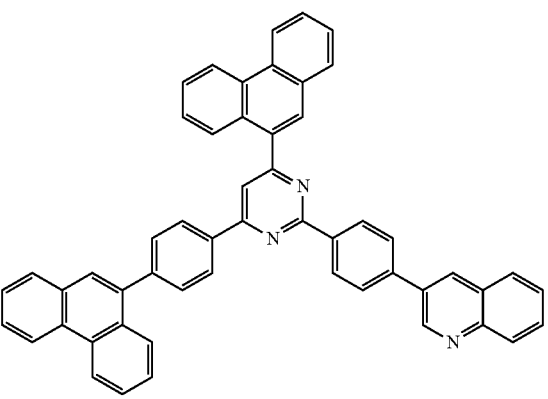
ET24
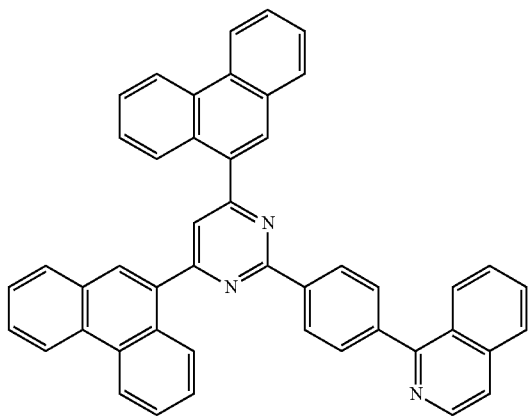

ET25
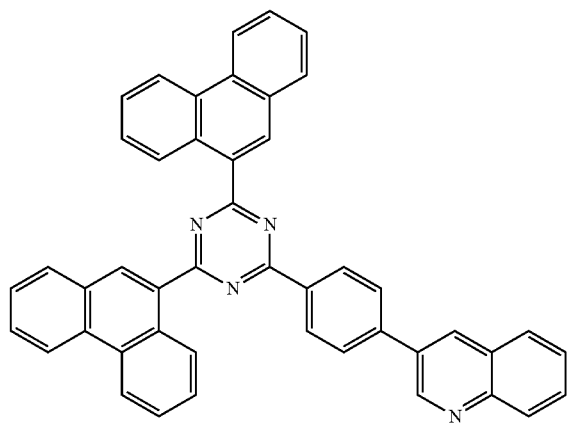
ET26
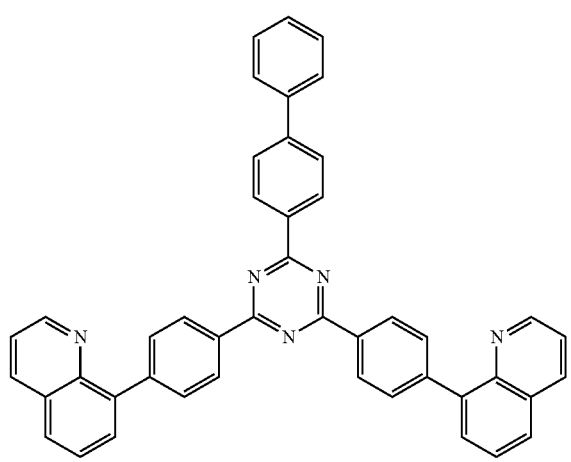
ET27
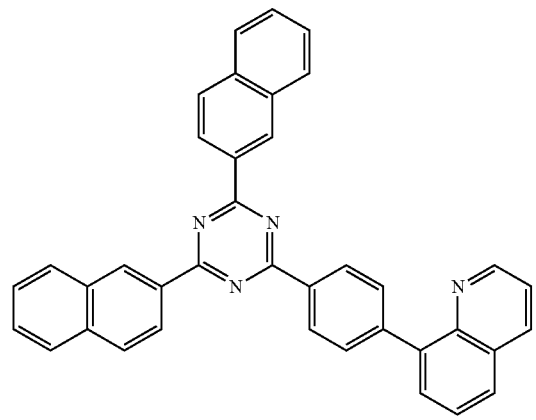
ET28
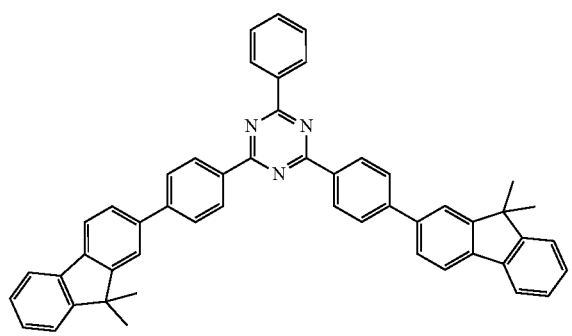
ET29
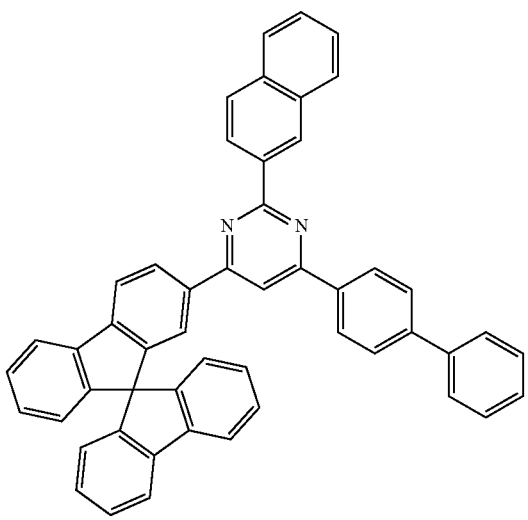
ET30
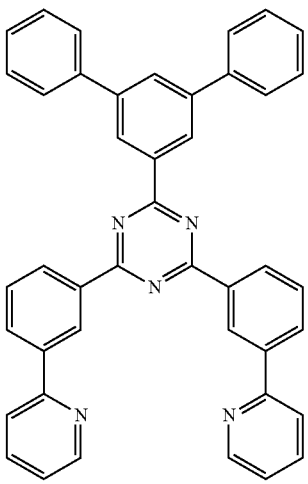

ET31
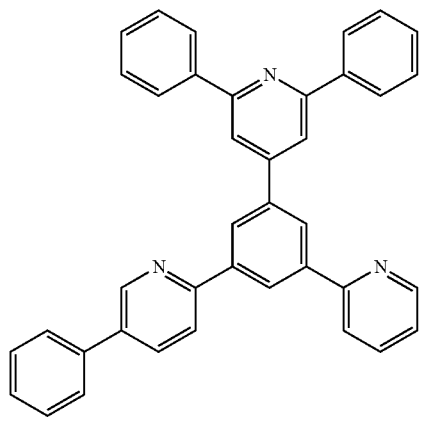
ET32
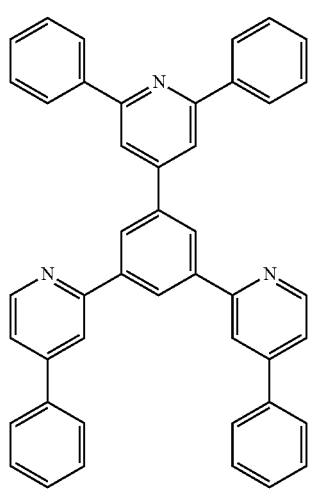
ET33
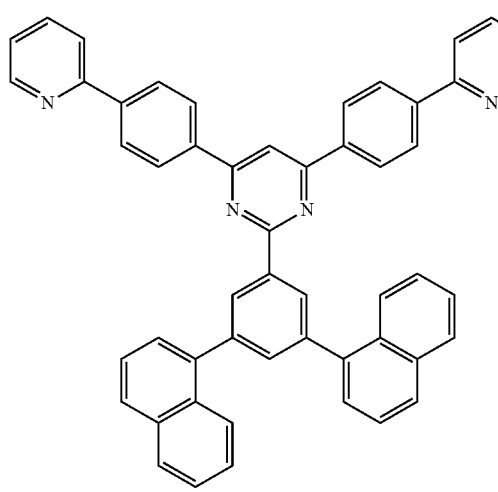
ET34
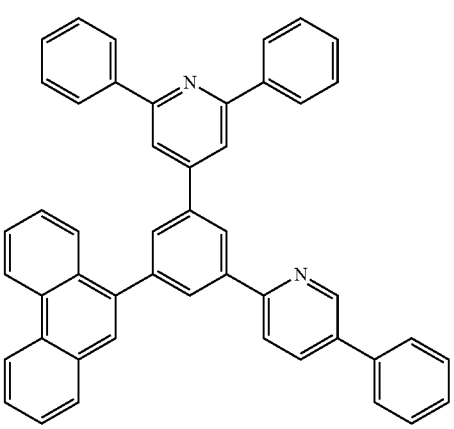
ET35
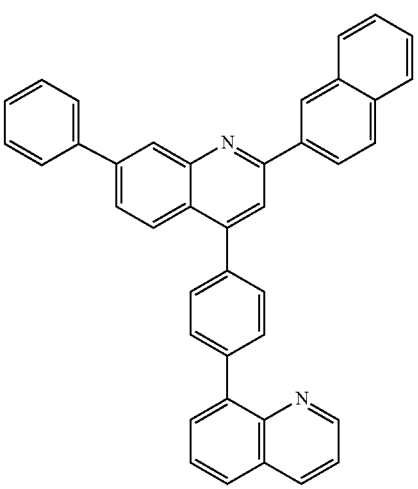
ET36
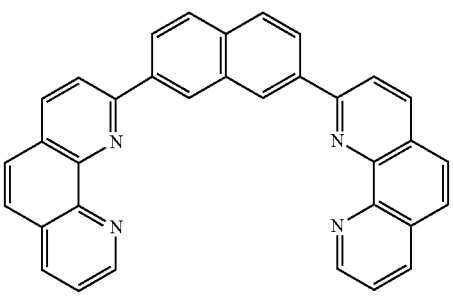
ET37
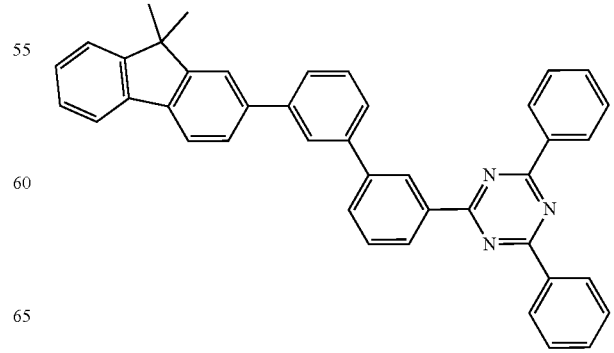

ET38
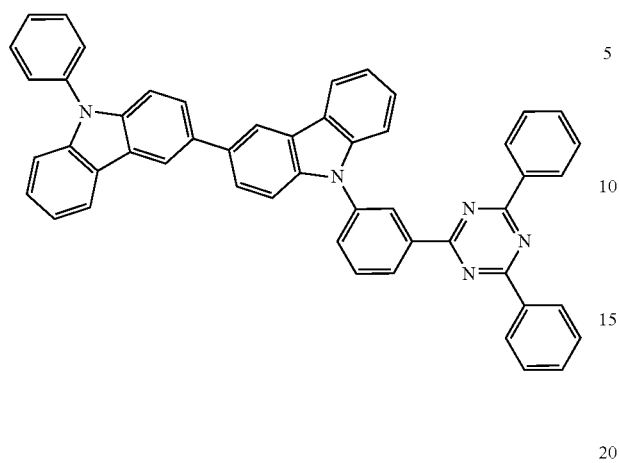
ET41
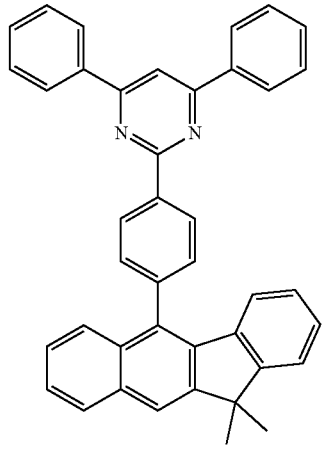
ET39
ET42
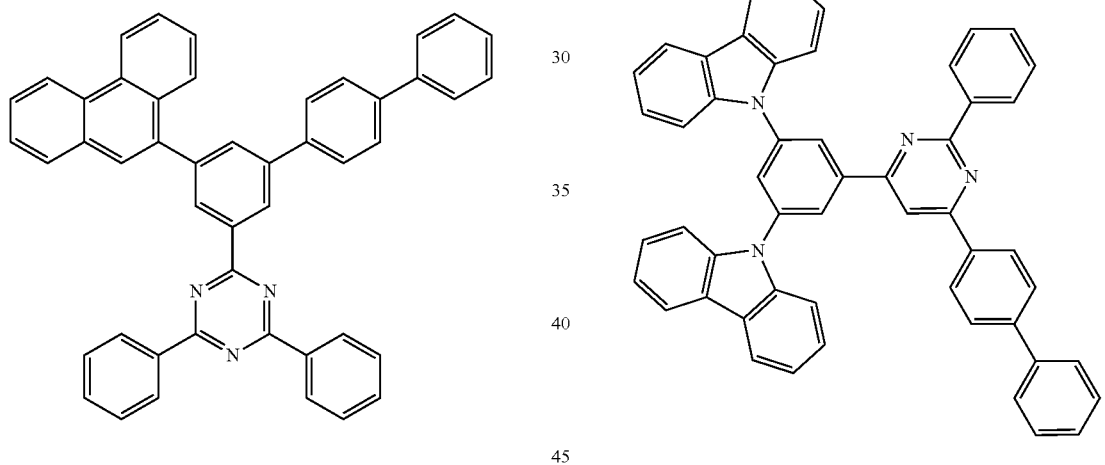
ET40
ET43
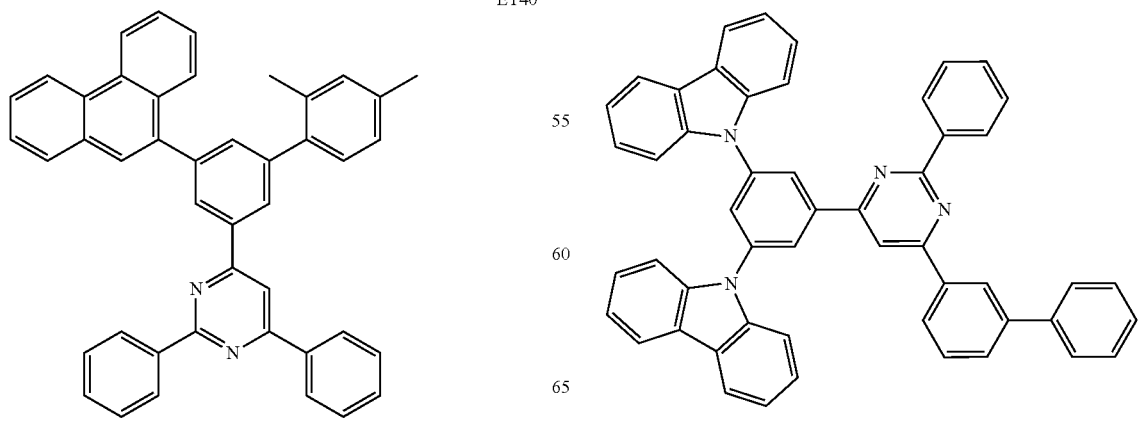

ET44

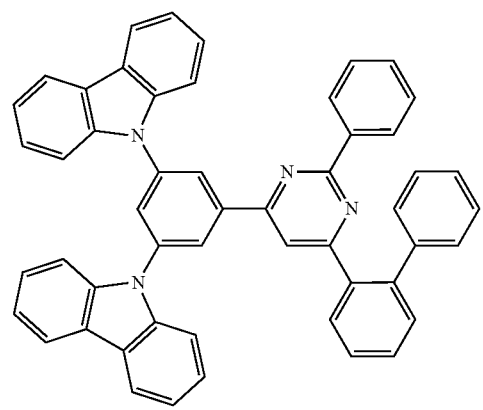

ET45

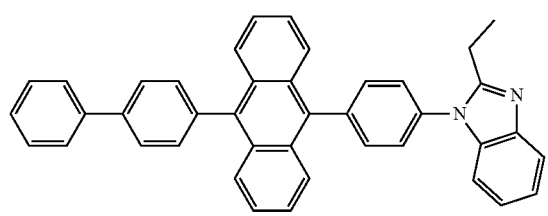

Alq₃

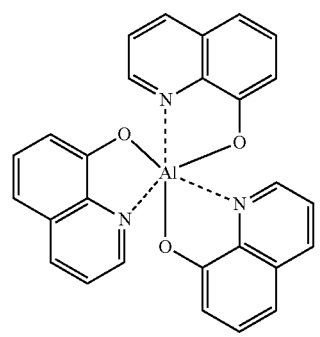

BAlq

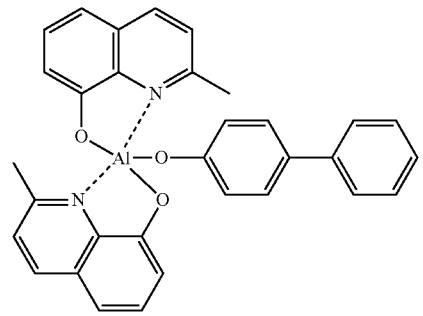

TAZ

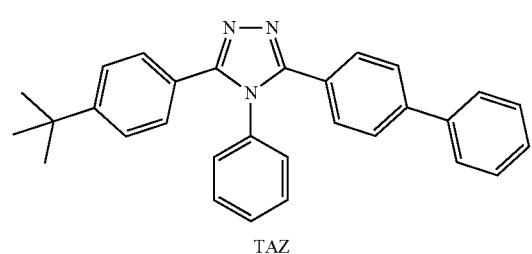

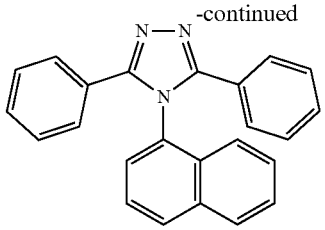

NTAZ

A thickness of the electron transport region may be in a range of about 50 Å to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thicknesses of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, and/or the electron transport layer are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

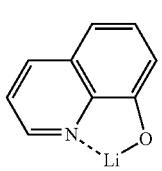

ET-D2

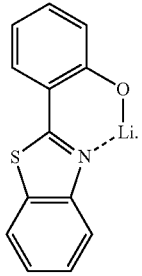

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including different materials, or iii) a multi-layered structure having multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodines), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number that satisfying 0<x<1), or $Ba_xCa_{1-x}O$ (wherein x is a real number that satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (e.g., a compound represented by Formula 601).

In embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of these ranges, excellent electron injection characteristics may be obtained without a substantial increase in driving voltage.

[Second Electrode 150]

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index equal to or greater than about 1.6 (at 589 nm).

The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include the compound represented by Formula 201, the compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

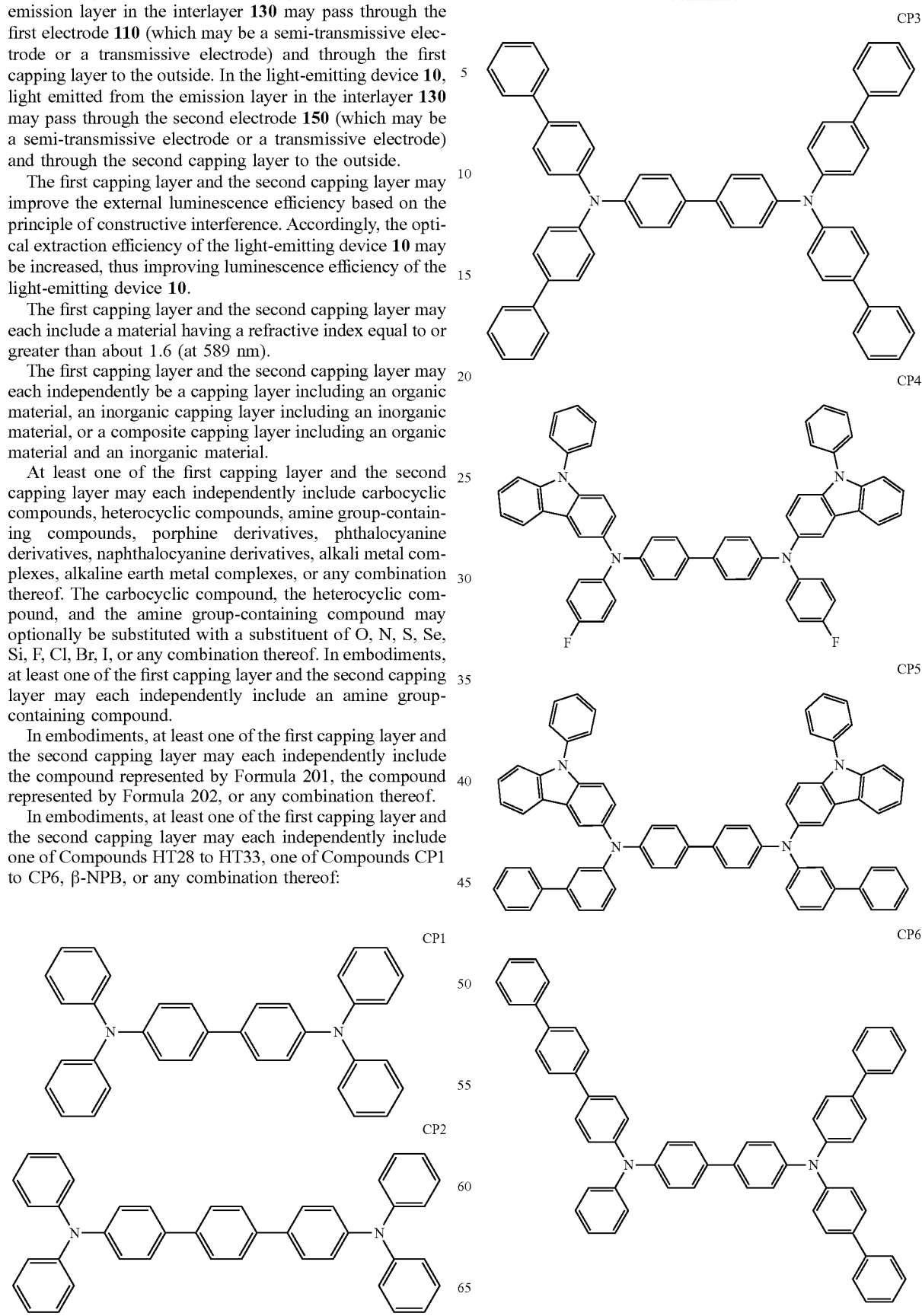

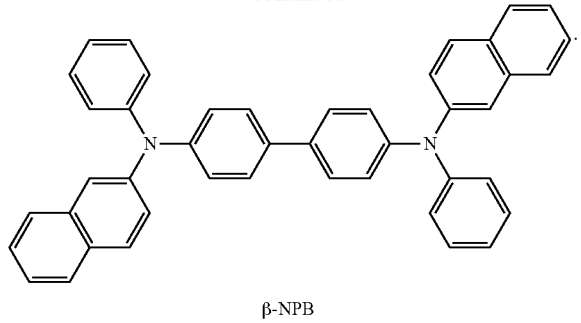

β-NPB

According to embodiments, an electronic apparatus may include the light-emitting device. The electronic apparatus may further include a thin-film transistor. In embodiments, the electronic apparatus may further include a thin-film transistor including a source electrode and drain electrode, and a first electrode of the light-emitting device may be electrically connected to the source electrode or the drain electrode. The electronic apparatus may further include a functional layer including a touchscreen layer, a polarization layer, a color filter, a color-conversion layer, or any combination thereof. The electronic apparatus may be understood by referring to the description of the electronic apparatus provided herein.

[Electronic Apparatus]

The electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In embodiments, the color-conversion layer may include quantum dots. The quantum dot may be, for example, the quantum dot described herein.

The electronic apparatus may include a first substrate. The first substrate may include sub-pixels, the color filter may include color filter areas respectively corresponding to the sub-pixels, and the color-conversion layer may include color-conversion areas respectively corresponding to the sub-pixels.

A pixel defining film may be located between the sub-pixels to define each sub-pixel.

The color filter may further include color filter areas and light-blocking patterns between the color filter areas, and the color-conversion layer may further include color-conversion areas and light-blocking patterns between the color-conversion areas.

The color filter areas (or color-conversion areas) may include: a first area emitting first color light; a second area emitting second color light; and/or a third area emitting third color light, and the first color light, the second color light, and/or the third color light may have different maximum emission wavelengths. In embodiments, the first color light may be red light, the second color light may be green light, and the third color light may be blue light. In embodiments, the color filter areas (or the color-conversion areas) may each include quantum dots. In embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent the air and moisture to permeate to the light-emitting device at the same time. The encapsulation unit may be a sealing substrate including a transparent glass or a plastic substrate. The encapsulation unit may be a thin-film encapsulating layer including at least one of an organic layer and/or an inorganic layer. When the encapsulation unit is a thin film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector.

Figure 3:
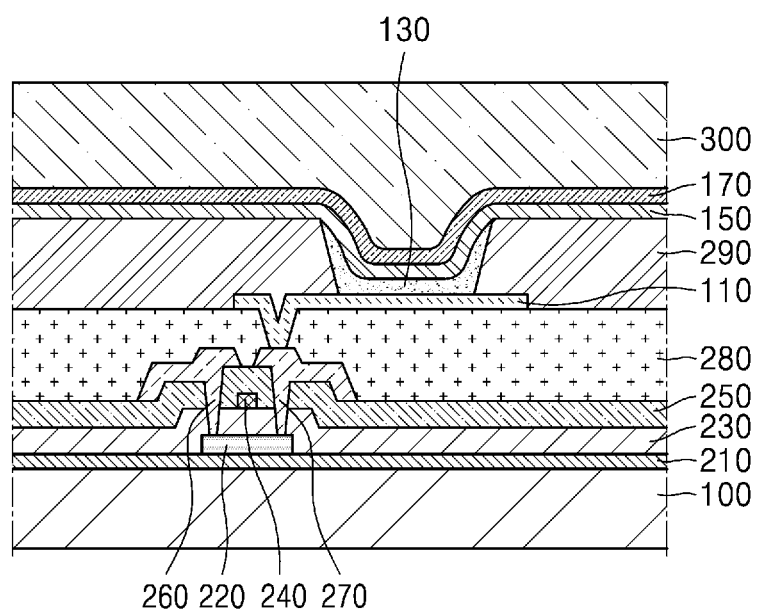
FIG. 3 is a schematic cross-sectional view of an electronic apparatus according to an embodiment.
Figure 4:
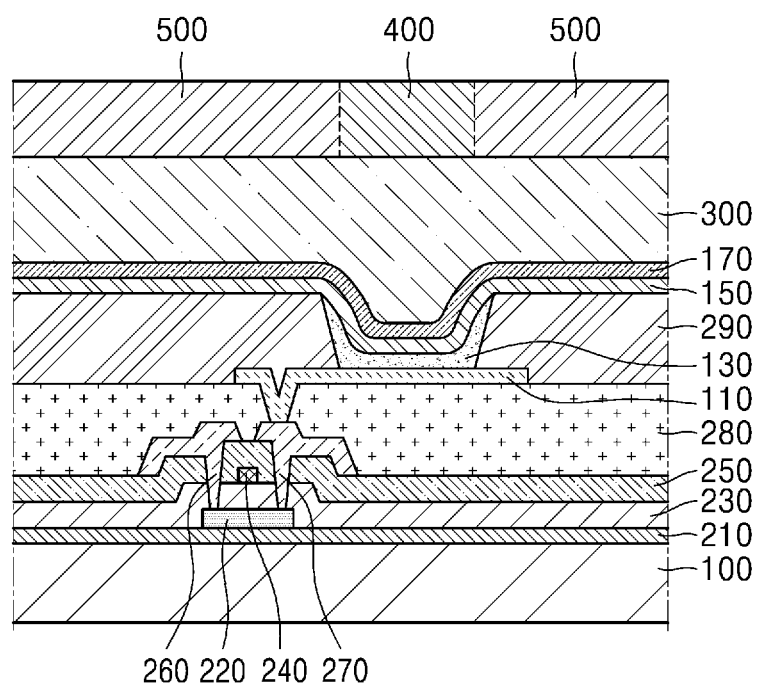
FIG. 4 is a schematic cross-sectional view of an electronic apparatus according to another embodiment.

Descriptions of FIGS. 3 and 4

FIG. 3 is a schematic cross-sectional view of an emission apparatus according to embodiments.

An emission apparatus in FIG. 3 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to electrically connect to the exposed drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or polyacryl organic film. Although it is not shown in FIG. 3, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, poly aryllate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 4 is a schematic cross-sectional view of another light-emitting apparatus according to an embodiment.

The emission apparatus shown in FIG. 4 may be substantially identical to the emission apparatus shown in FIG. 3, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In embodiments, the light-emitting device shown in FIG. 4 included in the emission apparatus may be a tandem light-emitting device.

[Manufacturing Method]

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

Definitions of Terms

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In embodiments,
the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl(bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include an azaadamantyl group and 9H-xanthenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The Term "$R_{10a}$" as Used Herein May be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

"Ph" used herein represents a phenyl group, "Me" used herein represents a methyl group, "Et" used herein represents an ethyl group, "ter-Bu" or "But" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, a light-emitting device according to embodiments will be described in more detail with reference to Examples.

EXAMPLES

Evaluation Example 1: Measurement of Energy Levels of $^1$CT, $^3$CT, and $^3$LE Energy Level of Exciplex 50 wt % of a hole transporting host and 50 wt % of an electron transporting host were coated on a quartz substrate to form a thin film. The thin film was subjected to i) measurement of the $^1$CT energy level of the exciplex from a PL spectrum at a temperature of 300 Kelvins (K) and ii) measurement of the $^3$CT energy level of the exciplex from a PL spectrum at a temperature of 4 K.

The $^3$LE energy level was measured from the PL spectrum at a temperature of 300 K of a thin film of the hole transporting host coated on a quartz substrate and the PL spectrum at a temperature of 300 K of a thin film of the electron transporting host coated on a quartz substrate.

The compounds shown in Table 1 were used as the hole transporting hosts and the electron transporting hosts in Thin Films A, B, C, D, and E.

TABLE 1

| | Hole transporting (HT) host | Electron transporting (ET) host | $^1$CT (eV) | $^3$CT (eV) | $^3$LE (HT host) (eV) | $^3$LE (ET host) (eV) | $\Delta E_{1CT-3LE}$ (eV) | $\Delta E_{CT}$ (eV) |
|---|---|---|---|---|---|---|---|---|
| Thin Film A | HTH8 | ETH6 | 3.02 | 2.89 | 2.96 | 2.91 | 0.06 | 0.13 |
| Thin Film B | HTH8 | ETH4 | 2.92 | 2.88 | 2.96 | 2.90 | 0.04 | 0.04 |
| Thin Film C | HTH8 | ETH5 | 2.95 | 2.88 | 2.96 | 2.93 | 0.01 | 0.07 |

TABLE 1-continued

| | Hole transporting (HT) host | Electron transporting (ET) host | $^1$CT (eV) | $^3$CT (eV) | $^3$LE (HT host) (eV) | $^3$LE (ET host) (eV) | $\Delta E_{1CT-3LE}$ (eV) | $\Delta E_{CT}$ (eV) |
|---|---|---|---|---|---|---|---|---|
| Thin Film D | HTH8 | ETH12 | 2.98 | 2.89 | 2.96 | 2.98 | 0.02 | 0.09 |
| Thin Film E | HTH8 | ETH13 | 2.99 | 2.66 | 2.96 | 2.63 | 0.03 | 0.33 |

As shown in Table 1, when Thin Film A was used, the hole transporting host and the electron transporting host formed an exciplex that satisfy Equations 1 and 2 described herein.

Evaluation Example 2: Measurement of Photoluminescence Quantum Yield (PLQY), $\phi_{DF}/\phi_{PF}$, Triplet Exciton Lifetime i) PLQY, ii) a ratio ($\phi_{DF}/\phi_{PF}$) of the delayed fluorescence PLQY to the prompt fluorescence PLQY, and iii) triplet exciton lifetime of Thin Films A, B, C, D, and E were measured from the PL spectra measured at a temperature of 300 K by a PL measurement apparatus. The results thereof are shown in Table 2. PLQY was measured by that PLQY in an excitation wavelength in a range of 280 nm to 320 nm was measured by using integrating sphere and taking an average value therefrom. A ratio of the delayed fluorescence PLQY to the prompt fluorescence PLQY based on the whole PLQY was measured from an amplitude ratio of a first component to a second component of transient PL decay curve.

TABLE 2

| | $\Phi_{PL}$ (PLQY) (%) | $\Phi_{DF}/\Phi_{PF}$ (%) | Triplet exciton lifetime ($\tau$) ($\mu$s) |
|---|---|---|---|
| Thin Film A | 36.4 | 24.1 | 2.4 |
| Thin Film B | 29.0 | 65.6 | 4.3 |
| Thin Film C | 34.9 | 52.1 | 3.6 |
| Thin Film D | 17.1 | 53.8 | 2.4 |
| Thin Film E | 48.0 | —[1)] | 36 |

[1)]Not measured

Referring to the results of Table 2, the $\phi_{DF}/\phi_{PF}$ value of Thin Film A was found to be smallest. Thus, it was found that a proportion of the prompt fluorescence was greater than a proportion of the delayed fluorescence among the fluorescence emitted from the exciplex formed in Thin Film A, which may result from that the energy gap of the $^1$CT-$^3$LE state is too large, thus suppressing intersystem crossing and increasing the proportion of prompt fluorescence. However, the emission mechanism is not limited thereto.

Thin Film A was found to have relatively short triplet exciton lifetime, as compared with Thin Films B, C, D, and E.

Evaluation Example 3: Measurement of Time-Resolved Photoluminescence (TRPL) Spectrum With respect to each of Thin Films A, B, C, D, and E, to confirm up-conversion from a triplet state (T1) to a singlet state (S1), excitation light (having an excitation wavelength of 337 nm and a pulse width of 700 pulse-width (ps)) from a nitrogen gas laser (available from USHIO, INC.) was focused, and the emitted light was collected by using a streak camera (C10627, Hamamatsu Photonics) to thereby obtain a TRPL curve in a range of 0 microseconds ($\mu$s) to about 50 $\mu$s. The results thereof are shown in FIG. 5.

Figure 5:
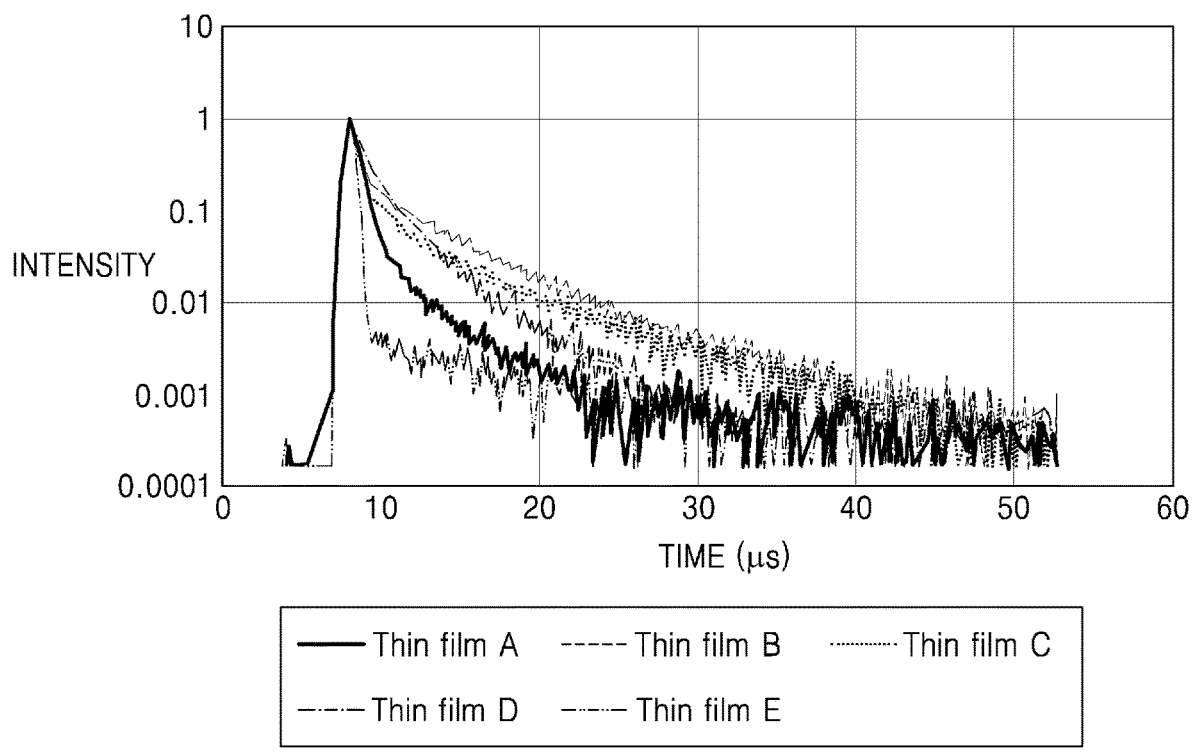
FIG. 5 is a graph of time-resolved photoluminescence (TRPL) spectrum curves of Films A, B, C, D, and E.

In the TRPL curve shown in FIG. 5, Thin Films A, B, C, and D each include two decay components. The two decay components may be a curve of prompt fluorescence components shown in a range of several microseconds and a curve of delayed fluorescence components shown in a range of several tens of microseconds. The curve of the delayed fluorescence components of Thin Film A was found to have a small PL amplitude, as compared with the curves of the delayed fluorescence components of Thin Films B, C, and D. The small PL amplitude may result from that the energy gap of the $^1$CT-$^3$LE state of the exciplex in Thin Film A is great, intersystem crossing is suppressed, triplet exciton density is lowered, and thus, the prompt fluorescence proportion is increased, however, embodiments are not limited thereto.

Regarding the TRPL curve shape of Thin Film E, the curve of the prompt fluorescence components and the curve of the delayed fluorescence components are distinguished. The distinguishment may result from that exciplex in Thin Film E may have a great $\Delta E_{CT}$, and thus, the triplet excitons may not undergo up-conversion to singlet excitons and annihilation. Accordingly, the delayed fluorescence of the exciplex host is not shown. The curve of the delayed fluorescence components of Thin Film E may result from delayed fluorescence emitted from a single host (e.g., a hole transporting host or an electron transporting host) that does not form an exciplex, but embodiments are not limited thereto.

Evaluation Example 4: Measurement of PLQY of Sensitizer and $\Delta E_{ST}$ of Delayed Fluorescence Dopant Sensitizer Compound Pt-13 was excited with an excitation light having a maximum absorption wavelength of the sensitizer, and PLQY was calculated using an integrating sphere.

The delayed fluorescence dopant Compound D1 was dissolved in toluene at a concentration of $10^{-5}$ M to prepare a sample. The PL spectrum of the sample was measured at a temperature of 300 K. Compound D1 was dissolved in tetrahydrofuran (THF) at a concentration of $10^{-5}$ M to prepare another sample. The PL spectrum of the other sample was measured at a temperature of 77 K. $\Delta E_{ST}$ was calculated from the difference of the onsets of the two PL spectra.

Sensitizer PLQY: 90%
$\Delta E_{ST}$ of delayed fluorescence dopant=0.06 eV

Example 1

As an anode, a substrate on which ITO were deposited was cut to a size of 50 millimeters (mm)×50 mm×0.5 mm, sonicated in isopropyl alcohol and pure water for 5 minutes in each solvent, cleaned with ultraviolet rays for 30 minutes, and then ozone, and mounted on a vacuum deposition apparatus.

m-MTDATA was deposited on the ITO substrate to form a hole injection layer having a thickness of 40 Å. NPB was vacuum-deposited on the hole injection layer to form a hole transport layer having a thickness of 1,000 Å. Compound HTH8, Compound ETH6, Compound Pt-13, and Compound D1 were co-deposited in a weight ratio of 50:50:13:0.4 on the hole transport layer to form an emission layer having a thickness of 400 Å. ET-1 was deposited on the emission layer to form an electron transport layer having a thickness of 300 Å. Thereafter, aluminum (Al) was deposited on the electron injection layer to form a cathode having a thickness of 1,200 Å, thereby completing the manufacture of a light-emitting device.

Comparative Examples 1 to 4

Light-emitting devices were manufactured in substantially the same manner as in Example 1, except that compounds shown in Table 3 were used in the formation of the emission layer.

Evaluation Example 5: Evaluation of Devices

The driving voltage, efficiency, and lifespan of the light-emitting devices manufactured in Example 1 and Comparative Examples 1 to 4 were measured by using a Keithley 236 source-measure unit (SMU) and a PR650 luminance meter. The results thereof are shown in Table 3. Here, the lifespan represents the time elapsed for the luminance to decrease to 95% of the initial luminance.

TABLE 3

|  | Emission layer | | | | Luminance (cd/m$^2$) | Driving voltage (V) | Efficiency (cd/A) | Lifespan (hours) |
| --- | --- | --- | --- | --- | --- | --- | --- | --- |
|  | Hole transporting host | Electron transporting host | Sensitizer | Delayed fluorescence dopant | | | | |
| Example 1 | HTH8 | ETH6 | Pt-13 | D1 | 1000 | 4.8 | 20.8 | 44.2 |
| Comparative Example 1 | HTH8 | ETH4 | Pt-13 | D1 | 1000 | 4.8 | 19.3 | 27.3 |
| Comparative Example 2 | HTH8 | ETH5 | Pt-13 | D1 | 1000 | 4.7 | 21.5 | 34.9 |
| Comparative Example 3 | HTH8 | ETH12 | Pt-13 | D1 | 1000 | 4.7 | 20.2 | 34.0 |
| Comparative Example 4 | HTH8 | ETH13 | Pt-13 | D1 | 1000 | 4.1 | 14.6 | 14.1 |

Referring to the results of Table 3, it was found that the light-emitting device of Example 1 had improved efficiency and lifespan, as compared with the light-emitting devices of Comparative Examples 1 to 4.

As apparent from the foregoing description, the energy gap between the $^1$CT state and the $^3$LE state of the exciplex may be controlled to increase an energy transfer proportion according to Förster energy transfer mechanism, and the exciplex may have a relatively short triplet exciton lifetime. As the light-emitting device includes an organometallic compound as a sensitizer and a delayed fluorescence dopant having a small FWHM as an emission dopant, the luminescence efficiency and colorimetric purity may be improved. Accordingly, the light-emitting device may have improved colorimetric purity, high efficiency, and long lifespan.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first electrode;
a second electrode facing the first electrode; and
an interlayer between the first electrode and the second electrode and comprising an emission layer, wherein the emission layer comprises:
a hole transporting host;
an electron transporting host;
a sensitizer; and
a delayed fluorescence dopant,
the hole transporting host and the electron transporting host form an exciplex,
the sensitizer comprises an organometallic compound,
the delayed fluorescence dopant does not comprise a metal atom, and
the exciplex satisfies Equations 1 and 2:

$$\Delta E_{1CT\text{-}3LE} = |E(^1CT) - E(^3LE)| \geq 0.06 \text{eV} \qquad \text{[Equation 1]}$$

$$E(^3LE) \geq E(^3CT) \qquad \text{[Equation 2]}$$

wherein in Equations 1 and 2,
$E(^1CT)$ represents an energy level (eV) of a singlet charge-transfer state ($^1CT$) of the exciplex,
$E(^3CT)$ represents an energy level (eV) of a triplet charge-transfer state ($^3CT$) of the exciplex, and
$E(^3LE)$ represents an energy level (eV) of a triplet localized excited state ($^3LE$) of the exciplex.

2. The light-emitting device of claim 1, wherein $\Delta E_{CT}$, which is an energy gap between $E(^1CT)$ and $E(^3CT)$ of the exciplex, is in a range of about 0.1 electron volts (eV) to about 0.2 eV.

3. The light-emitting device of claim 1, wherein $\Phi_{DF}/\Phi_{PF}$, which is a ratio of a delayed fluorescence photoluminescence quantum yield (PLQY) ($\Phi_{DF}$) to a prompt fluorescence PLQY ($\Phi_{PF}$) of the exciplex, is equal to or less than about 0.3.

4. The light-emitting device of claim 1, wherein
the energy level of the triplet localized excited state of the exciplex comprises $E1(^3LE)$ and $E2(^3LE)$, $$E1(^3LE) E2(3LE),$$

E1($^3$LE) is equal to a triplet energy level (eV) of the hole transporting host, and E2($^3$LE) is equal to a triplet energy level (eV) of the electron transporting host.

5. The light-emitting device of claim 4, wherein $E1(^3LE) > E2(^3LE)$, and the exciplex satisfies $E(^1CT) - E1(^3LE) \geq 0.06$ eV.

6. The light-emitting device of claim 1, wherein the exciplex satisfies $E(^1CT) > E(^3LE)$.

7. The light-emitting device of claim 1, wherein a difference between an energy level of a highest occupied molecular orbital (HOMO) of the hole transporting host and an energy level of a HOMO of the electron transporting host is equal to or greater than about 0.2 eV, and a difference between an energy level of a lowest unoccupied molecular orbital (LUMO) of the hole transporting host and an energy level of a LUMO of the electron transporting host is equal to or greater than about 0.2 eV.

8. The light-emitting device of claim 1, wherein the delayed fluorescence dopant satisfies Equation 3:

$$\Delta E_{ST} = E_D(S1) - E_D(T1) \leq 0.2 \text{eV} \quad \text{[Equation 3]}$$

wherein in Equation 3, $E_D(S1)$ represents a lowest singlet energy level (eV) of the delayed fluorescence dopant, and $E_D(T1)$ represents a lowest triplet energy level (eV) of the delayed fluorescence dopant.

9. The light-emitting device of claim 1, wherein the light-emitting device satisfies Equation 4:

$$E_{EX}(T1) > E_S(T1) > E_D(T1) \quad \text{[Equation 4]}$$

wherein in Equation 4, $E_{EX}(T1)$ represents a lowest triplet energy level (eV) of the exciplex, $E_S(T1)$ represents a lowest triplet energy level (eV) of the sensitizer, and $E_D(T1)$ represents a lowest triplet energy level (eV) of the delayed fluorescence dopant.

10. The light-emitting device of claim 1, wherein the sensitizer does not emit light, and the delayed fluorescence dopant emits fluorescence.

11. The light-emitting device of claim 1, wherein the light-emitting device emits blue light having a maximum emission wavelength in a range of about 450 nanometers (nm) to about 470 nm.

12. The light-emitting device of claim 1, wherein the hole transporting host comprises a compound comprising at least one carbazole group.

13. The light-emitting device of claim 1, wherein the hole transporting host comprises a compound represented by Formula 1-1 or Formula 1-2:

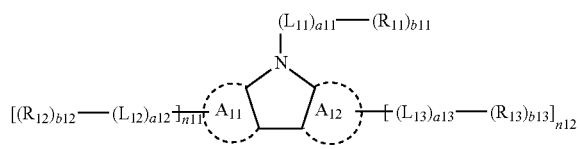
[Formula 1-1]

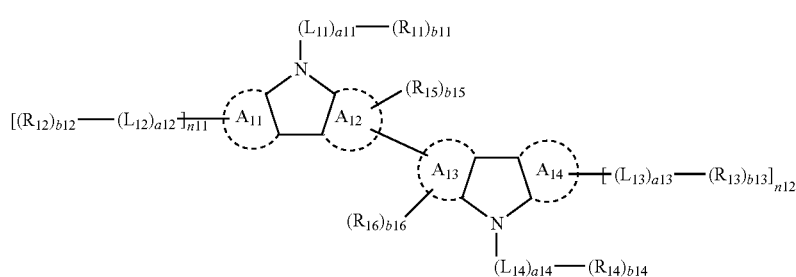
[Formula 1-2]

wherein in Formulae 1-1 and 1-2, $A_{11}$ to $A_{14}$ are each independently a $C_3$-$C_{60}$ carbocyclic group or a $C_1$-$C_{60}$ heterocyclic group, $L_{11}$ to $L_{14}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a14 are each independently an integer from 0 to 5, $R_{11}$ to $R_{16}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b11 to b16, n11, and n12 are each independently an integer from 1 to 5, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group;

a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

14. The light-emitting device of claim 1, wherein the electron transporting host is a compound comprising at least one π electron-deficient nitrogen-containing 6-membered ring.

15. The light-emitting device of claim 1, wherein the electron transporting host is a compound represented by Formula 2:

[Formula 2]

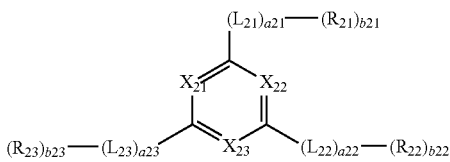

wherein in Formula 2, $X_{21}$ is N or C-($L_{24}$)$_{a24}$-($R_{24}$)$_{b24}$,
$X_{22}$ is N or C-($L_{25}$)$_{a25}$-($R_{25}$)$_{b25}$,
$X_{23}$ is N or C-($L_{26}$)$_{a26}$-($R_{26}$)$_{b26}$,
$L_{21}$ to $L_{26}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
a21 to a26 are each independently an integer from 0 to 5,
$R_{21}$ to $R_{26}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b26 are each independently an integer from 1 to 5, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

16. The light-emitting device of claim 1, wherein the sensitizer comprises an organometallic compound represented by Formula 3:

[Formula 3]

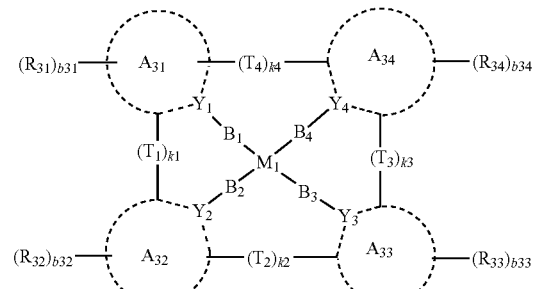

wherein in Formula 3, $M_1$ is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $Y_1$ to $Y_4$ are each independently C, $A_{31}$ to $A_{34}$ are each independently a $C_3$-$C_{60}$ carbocyclic group or a $C_1$-$C_{60}$ heterocyclic group, $B_1$ to $B_4$ are each independently selected from a chemical bond, O, and S, $T_1$ to $T_4$ are each independently *—O—*', *—S—*', *—C($R_{35}$)($R_{36}$)—*', *—C($R_{35}$)═*', *—C($R_{35}$)═*', *—C($R_{35}$)═C($R_{36}$)—*', *—C(═O)—*', *—C(═S)—*', *—C≡C—*', *—B($R_{35}$)—*', *—N($R_{35}$)—*', *—P($R_{35}$)—*', *—Si($R_{35}$)($R_{36}$)—*', *—P(═O)($R_{35}$)—*', or *—Ge($R_{35}$)($R_{36}$)—*', k1 to k4 are each independently an integer from 0 to 3, a sum of k1 to k4 is equal to or greater than 3, $R_{31}$ to $R_{36}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), at least two adjacent groups of $R_{31}$(s) in the number of b31, $R_{32}$(s) in the number of b32, $R_{33}$(s) in the number of b33, $R_{34}$(s) in the number of b34, $R_{35}$, and $R_{36}$ are optionally bound to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b31 to b34 are each independently an integer from 1 to 5, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and

* and *' each indicate a binding site to an adjacent atom.

17. The light-emitting device of claim 1, wherein the delayed fluorescence dopant comprises a condensed-cyclic compound represented by Formula 4:

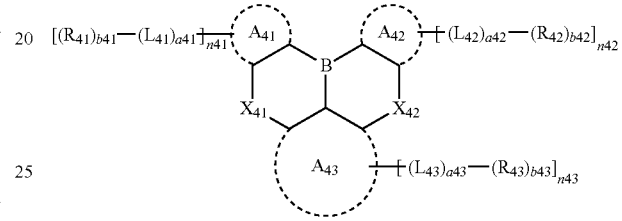

[Formula 4]

$[(R_{41})_{b41}-(L_{41})_{a41}]_{n41}$ ... $[(L_{42})_{a42}-(R_{42})_{b42}]_{n42}$ $[(L_{43})_{a43}-(R_{43})_{b43}]_{n43}$ wherein in Formula 4, $A_{41}$ to $A_{43}$ are each independently a $C_3$-$C_{60}$ carbocyclic group or a $C_1$-$C_{60}$ heterocyclic group, $X_{41}$ S C($R_{44}$)($R_{45}$), N($R_{44}$), O, or S, $X_{42}$ is C($R_{46}$)($R_{47}$), N($R_{46}$), O, or S, $L_{41}$ to $L_{43}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a41 to a43 are each independently an integer from 0 to 5, $R_{41}$ to $R_{47}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b41 to b43 and n41 to n43 are each independently an integer from 1 to 5, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

18. An electronic apparatus comprising the light-emitting device of claim 1.

19. The electronic apparatus of claim 18, further comprising a thin-film transistor,
wherein the thin-film transistor comprises a source electrode and a drain electrode, and
the first electrode of the light-emitting device is electrically connected to the source electrode or the drain electrode of the thin-film transistor.

20. The electronic apparatus of claim 18, further comprising a functional layer comprising a touchscreen layer, a polarization layer, a color filter, a color-conversion layer, or a combination thereof.

* * * * *